US010631100B2

(12) United States Patent
Chiang et al.

(10) Patent No.: US 10,631,100 B2
(45) Date of Patent: Apr. 21, 2020

(54) MICRO-ELECTRICAL MECHANICAL SYSTEM SENSOR PACKAGE AND METHOD OF MANUFACTURE THEREOF

(71) Applicant: Infineon Technologies AG, Neubiberg (DE)

(72) Inventors: Chau Fatt Chiang, Melaka (MY); Kok Yau Chua, Melaka (MY)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/129,419

(22) Filed: Sep. 12, 2018

(65) Prior Publication Data

US 2020/0084550 A1   Mar. 12, 2020

(51) Int. Cl.
| | |
|---|---|
| *H04R 19/04* | (2006.01) |
| *B81B 7/04* | (2006.01) |
| *B81C 1/00* | (2006.01) |
| *H04R 19/00* | (2006.01) |
| *H04R 31/00* | (2006.01) |

(52) U.S. Cl.
CPC .............. *H04R 19/04* (2013.01); *B81B 7/04* (2013.01); *B81C 1/00214* (2013.01); *H04R 19/005* (2013.01); *H04R 31/003* (2013.01); *B81B 2201/0257* (2013.01); *B81B 2207/012* (2013.01); *B81B 2207/07* (2013.01); *B81B 2207/096* (2013.01); *B81C 2203/0792* (2013.01); *H04R 2201/003* (2013.01)

(58) Field of Classification Search
CPC ...... H01L 2924/00; H01L 2224/48091; H04R 2430/21; H04R 3/04; H04R 7/04; H04R 9/08; B81B 2207/05; B81B 2207/093; B81B 2207/115

USPC .............. 381/174, 151, 356, 357, 369, 355; 257/687, 704
See application file for complete search history.

(56) References Cited

U.S. PATENT DOCUMENTS

| | | | |
|---|---|---|---|
| 2007/0071268 A1* | 3/2007 | Harney | B81B 7/0064 381/355 |
| 2008/0166000 A1 | 7/2008 | Hsiao | |
| 2008/0298621 A1* | 12/2008 | Theuss | B81C 1/0023 381/360 |
| 2011/0075875 A1* | 3/2011 | Wu | B81C 1/0023 381/361 |
| 2012/0082325 A1 | 4/2012 | Sakurauchi et al. | |
| 2012/0104629 A1 | 5/2012 | Bolognia et al. | |
| 2012/0321111 A1* | 12/2012 | Lillelund | H04R 1/04 381/174 |
| 2013/0128487 A1 | 5/2013 | Lo et al. | |

(Continued)

FOREIGN PATENT DOCUMENTS

CN           201499272 U    6/2010

*Primary Examiner* — Curtis A Kuntz
*Assistant Examiner* — Julie X Dang
(74) *Attorney, Agent, or Firm* — Slater Matsil, LLP

(57) ABSTRACT

A device includes: a first sidewall including a first opening extending through the first sidewall; a first sensor attached to an interior surface of the first sidewall, wherein the first sensor is aligned to at least partially cover the first opening; a second sidewall opposite the first sidewall; a third sidewall attaching the first sidewall to the second sidewall; and a first contact pad disposed on an exterior surface of the third sidewall, wherein the first contact pad is configured to provide at least one of a power connection or a signal connection for the first sensor.

28 Claims, 20 Drawing Sheets

(56) References Cited

U.S. PATENT DOCUMENTS

| | | | |
|---|---|---|---|
| 2014/0072151 A1* | 3/2014 | Ochs | H04R 23/00 |
| | | | 381/174 |
| 2014/0246738 A1* | 9/2014 | Protheroe | B81C 1/00269 |
| | | | 257/416 |
| 2014/0246739 A1* | 9/2014 | Protheroe | B81C 1/00269 |
| | | | 257/416 |
| 2015/0023523 A1* | 1/2015 | Elian | H04R 1/083 |
| | | | 381/91 |
| 2015/0102478 A1* | 4/2015 | Suthiwongsunthorn | ................ |
| | | | H01L 24/45 |
| | | | 257/680 |
| 2016/0214857 A1* | 7/2016 | Lin | B81B 7/007 |

\* cited by examiner though the affixing forms an interior cavity between the lid and the substrate that is bounded by a molding compound, and where the affixing causes a second end of the interconnect, opposite the first end of the interconnect, to be attached to the second landing pad; and forming an external contact pad and a trace on an exposed surface of the molding compound, where a first end of the trace is coupled to the external contact pad and a second end of the trace is coupled to the interconnect structure.

MICRO-ELECTRICAL MECHANICAL SYSTEM SENSOR PACKAGE AND METHOD OF MANUFACTURE THEREOF

TECHNICAL FIELD

The present disclosure relates generally to sensors, and, in particular embodiments, to a micro-electrical mechanical system (MEMS) sensor package and a method of manufacture thereof.

BACKGROUND

Generally, micro-electrical mechanical system (MEMS) sensor devices operate on physically sensible environmental conditions. For example, MEMS devices may sense sound, air pressure, motion, or the like. MEMS devices are generally simple sensor devices that generate a raw electrical signal. MEMS sensors, such as MEMS microphones, have a movable membrane that reacts to pressure waves in air in an interior cavity of the MEMS microphone to generate the electrical signal. A MEMS microphone package frequently includes a control chip, such as an application specific integrated circuit (ASIC), to manage the MEMS microphone, read the raw data signal from the MEMS microphone, and convert the data signal into a desired data format. In MEMS microphone package, the MEMS microphone and the control chip are disposed in a cavity of the device package.

SUMMARY

An embodiment device includes: a first sidewall including a first opening extending through the first sidewall; a first sensor attached to an interior surface of the first sidewall, wherein the first sensor is aligned to at least partially cover the first opening; a second sidewall opposite the first sidewall; a third sidewall attaching the first sidewall to the second sidewall; and a first contact pad disposed on an exterior surface of the third sidewall, wherein the first contact pad is configured to provide at least one of a power connection or a signal connection for the first sensor.

An embodiment MEMS microphone package includes: a first lid forming a first sidewall of the MEMS microphone package, the first lid including a first acoustic input port extending through the first lid; a first MEMS microphone die attached to an interior surface of the first lid, where the first MEMS microphone die is aligned to at least partially cover the first acoustic input port; a second sidewall opposite the first lid; a molding compound forming a third sidewall and attaching the first lid to the second sidewall; and a first input/output (I/O) pad disposed on an exterior surface of the molding compound, where the first I/O pad is configured to provide at least one of a power connection or a signal connection for the first MEMS microphone die.

An embodiment method includes: attaching a first side of a sensor to a first side of a lid, the sensor having a contact pad disposed on a second side of the sensor opposite the first side; providing an interconnect on the contact pad, where a first end of the interconnect is attached to the contact pad, and where the interconnect extends away from the contact pad; attaching a control chip to a first side of a substrate and electrically connecting the control chip to a first landing pad disposed at the first side of the substrate, the substrate further including a second landing pad disposed at the first side of the substrate and an interconnect structure disposed in a body of the substrate and electrically coupled to the second

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
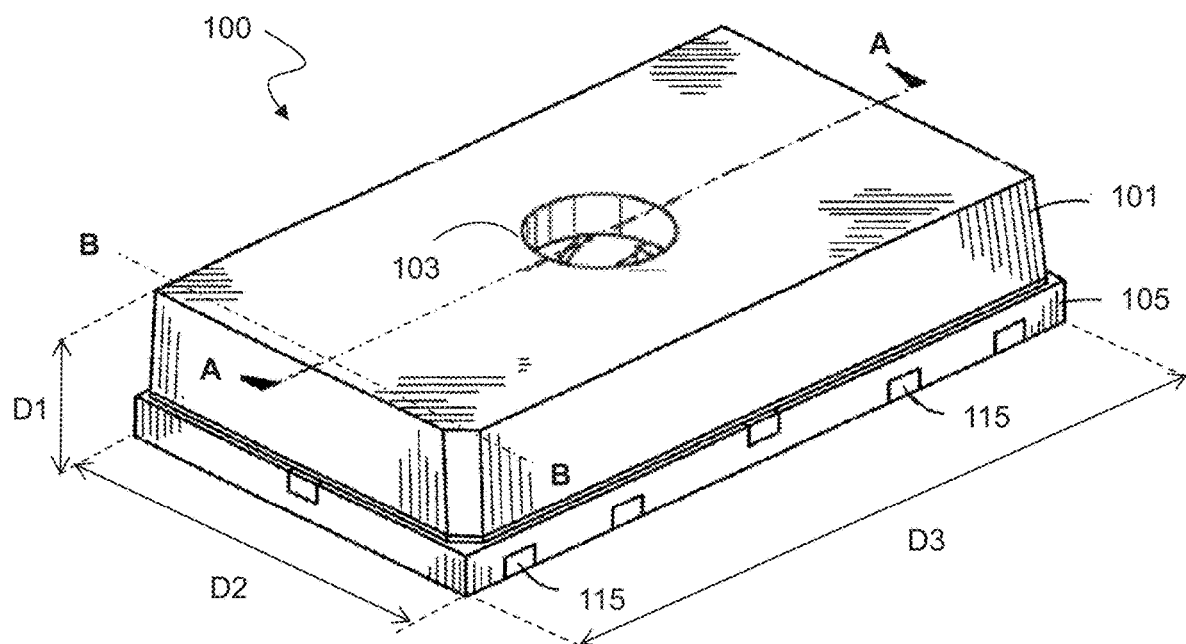
FIG. 1A schematically shows a top perspective view of a top-ported MEMS microphone package.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The increasing complexity of electronic systems has given rise to requirements for ever increasing functionality in those electronic systems and decreasing size in the components used for the systems. In particular, personal electronic devices have an increasing number of microphones in order to detect sound in a variety of device orientations and additional sensors for new features. As the number of sensors increased, the space allocated to each sensor (and consequently to the microphones) decreases. Embodiments provide a MEMS microphone package and method of manufacture thereof that reduces package size and increases reliability and sensitivity. In particular, the disclosed embodiments are compact in size (e.g. having a small package footprint); have a standard bill of materials, while being easily configurable to be a top-ported MEMS microphone package, a bottom-ported MEMS microphone package, or a side-ported MEMS microphone package; are modular in design so that it can easily be combined with other like MEMS microphone packages, at the package-level, to form a compact microphone array that may be suitable for mobile applications; and are sensitive to sound waves travelling laterally (sideways) to the MEMS microphone package, without the use of additional features (e.g. sound guides).

Figure 1B:
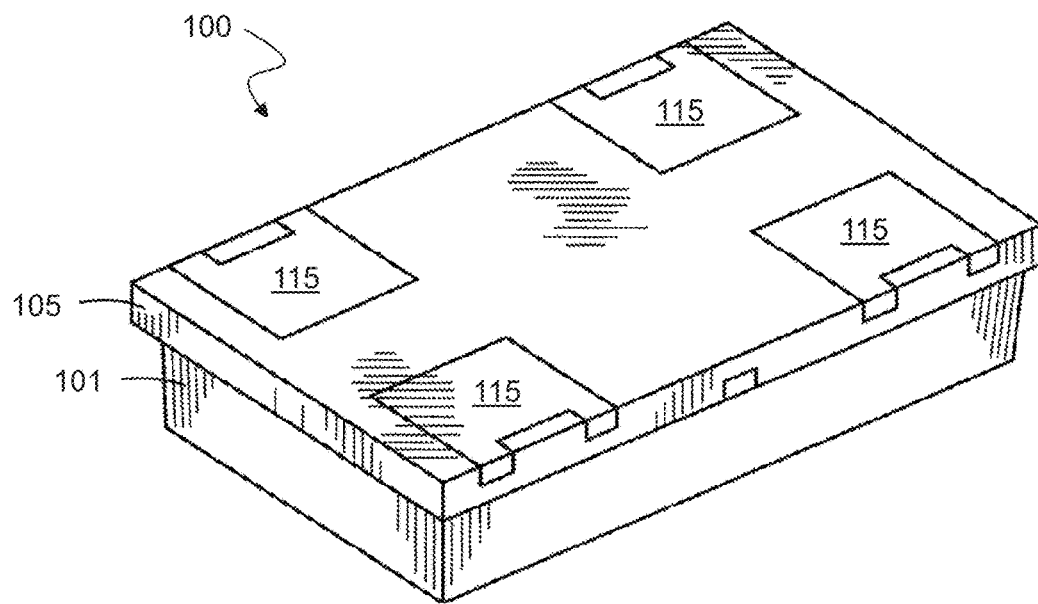
FIG. 1B schematically shows a bottom perspective view of the top-ported MEMS microphone package shown in FIG. 1A.
Figure 1C:
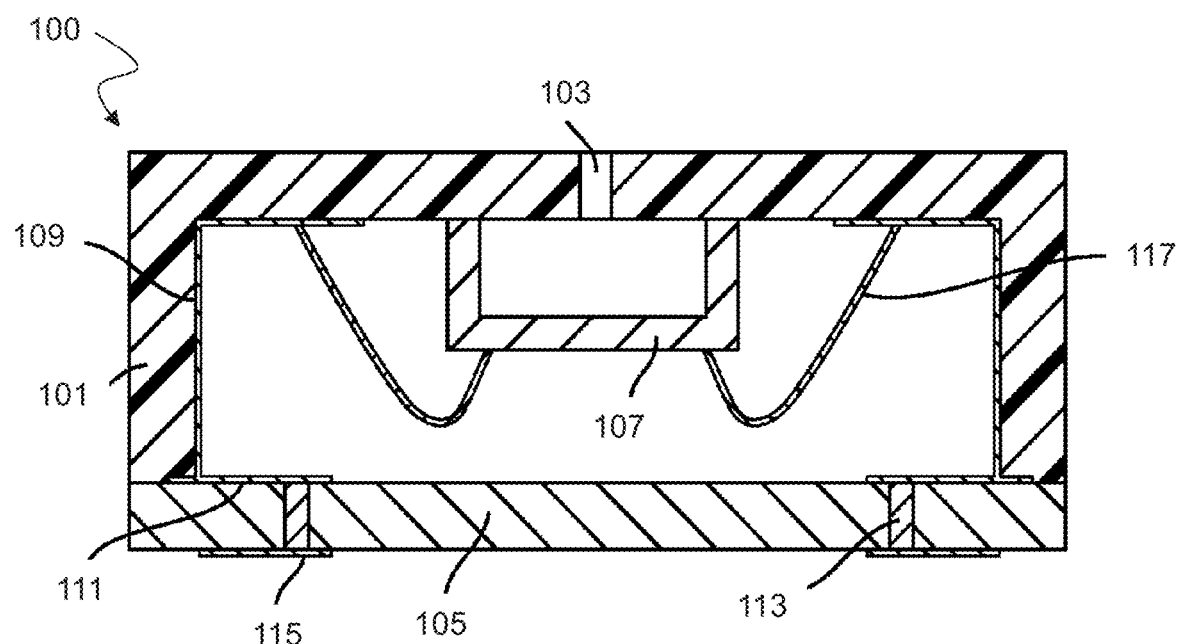
FIGS. 1C to 1F schematically show various cross-sectional views of the top-ported MEMS microphone package of FIG. 1A.
Figure 1D:
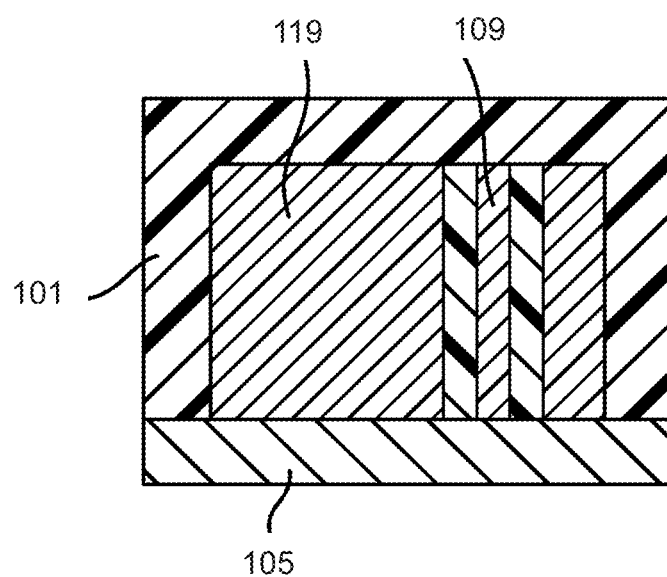
Figure 1E:
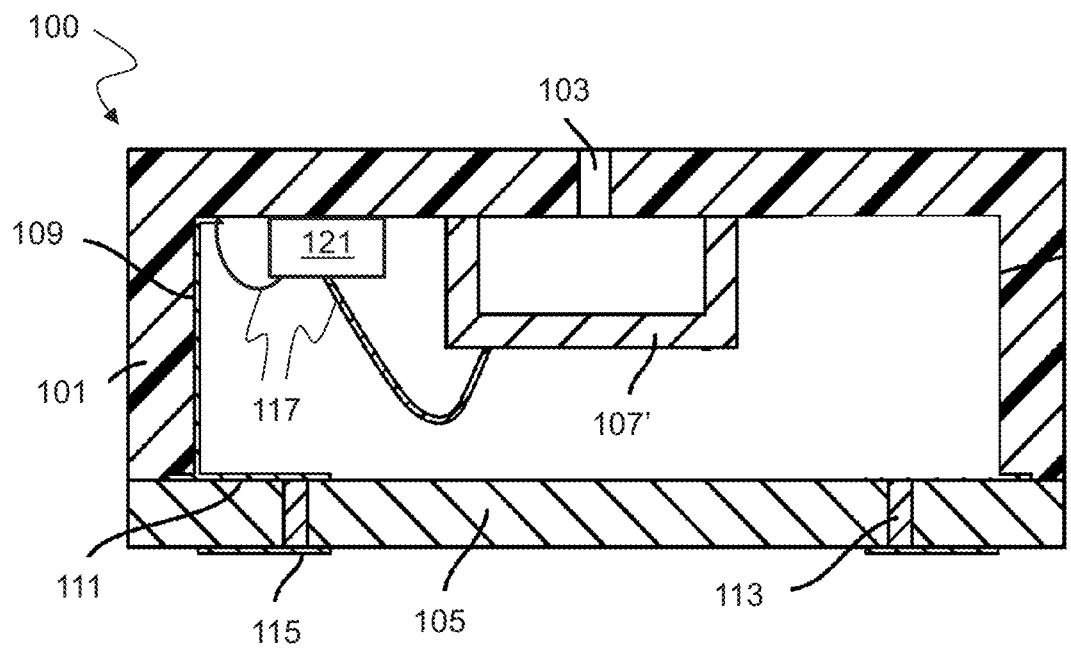
Figure 1F:
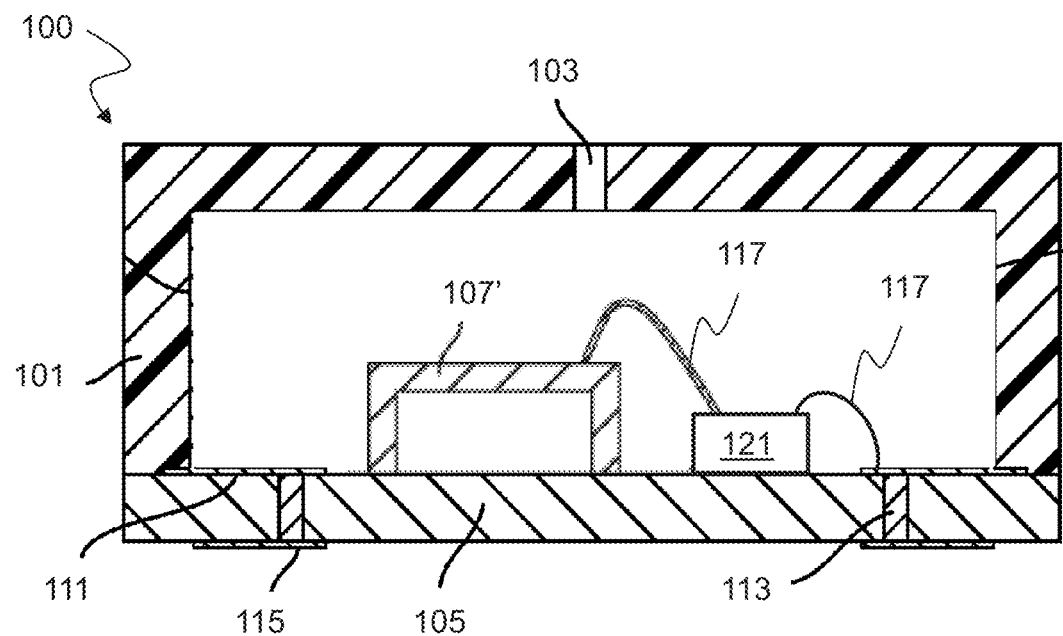

FIG. 1A schematically shows a top perspective view of a top-ported MEMS microphone package 100. FIG. 1B schematically shows a bottom perspective view of the top-ported MEMS microphone package 100 shown in FIG. 1A. FIGS. 1C, 1E, and 1F schematically show various examples of a cross-sectional view of the top-ported MEMS microphone package 100 of FIG. 1A across a line A-A. FIG. 1D provides another cross-sectional view of the top-ported MEMS microphone package 100 of FIG. 1A across a line B-B. The MEMS microphone package 100 may be used in any of a wide variety of applications. For example, the MEMS microphone package 100 may be used with mobile telephones, land-line telephones, computer devices, video games, hearing aids, hearing instruments, biometric security systems, two-way radios, public announcement systems, and other devices that transduce signals. The MEMS microphone package 100 may have a first dimension D1 (e.g. a thickness) between about 0.9 mm and 2 mm, a second dimension D2 (e.g. a depth) between about 2 mm and 7 mm, and a third dimension D3 (e.g. a width) between about 3 mm and 10 mm.

Referring to FIG. 1A, the MEMS microphone package 100 includes a lid component 101 and an acoustic input port 103 formed through the lid 101. The lid 101 may be an injection-molded thermoplastic component or a laminate substrate with integrated electronic circuit traces, as described in further detail below. As illustrated in FIG. 1C, the lid 101 is formed with a hollow cavity inside. The lid 101 is coupled to a substrate layer 105 to form a sealed cavity. The substrate layer 105 may be a laminate substrate including, for example, printed circuit board (PCB) material, such as FR-4. In other examples, the substrate layer 105 may be a premolded leadframe-type package (also referred to as a "premolded package"). Further examples of the substrate layer 105 include ceramic cavity packages.

As illustrated in FIG. 1C, a MEMS microphone die 107 is mounted to the lid 101 adjacent to or covering the acoustic port opening 103 such that acoustic pressures (e.g. sound waves) entering the MEMS microphone package 100 through the acoustic input port 103 engage or interact with the MEMS microphone die 107 to produce an electrical signal that, with additional (exterior and/or interior) components (e.g., a speaker and accompanying circuitry), produce an output audible signal corresponding to the input acoustic pressures. The MEMS microphone die 107 may be mounted to the lid 101 by an adhesive or another fastening mechanism known in the art.

Conductive traces 109 (e.g. metal traces) are deposited on at least a portion of the interior surface of the lid 101. When the substrate layer 105 is sealed to the lid 101 (e.g. via a conductive or non-conductive sealant known in the art), the conductive traces 109 are electrically coupled with corresponding traces 111 formed on the substrate layer 105. In the example of FIG. 1C, the circuit traces 111 on the substrate layer 105 are coupled to one or more conductive vias 113 which, in turn, are coupled to one or more electrical contact pads 115 on the bottom surface of the substrate layer 105. The electrical contact pads 115 are shown in greater detail in the bottom perspective view of FIG. 1B. The electrical contact pads 115, also referred to as package input/output (I/O) pads, electrically connect the MEMS microphone package 100 to another substrate, such as a main board, a printed circuit board, or other electrical interconnect apparatus. The electrical contact pads 115 may provide power and signal connections for the MEMS microphone package 100.

FIG. 1D provides a more detail view of the interior surface of the lid 101 and represents the cross-sectional view of the top-ported MEMS microphone package 100 across line B-B of FIG. 1A. As noted above, conductive traces 109 deposited on the interior walls of the lid 101 provide for electrical routing between the lid 101 and the substrate layer 105. However, in this example, interior surfaces of the lid 101 that are not used for electrical routing between the lid 101 and the substrate layer 105 are covered with a conductive layer 119 that is grounded to the substrate layer 105. The conductive layer 119, together with the substrate layer 105 (which may also include a conductive ground plate), forms a Faraday's cage that provides improved electromagnetic shielding of the MEMS microphone package 100. In some examples, the conductive layer 119 may, additionally or alternatively, be positioned at or around the exterior surface of the lid 101, with the conductive layer 119 being coupled to the grounding of the substrate 105 to provide for electromagnetic shielding of the MEMS microphone package 100. In such examples, the conductive layer 119 may be a single layer uniformly coating the lid 101 or may take the form of vias arranged along saw-streets of the lid 101. As shown in FIG. 1C, wires 117 extend from the MEMS microphone die 107 to couple the MEMS microphone die 107 to the conductive traces 109 formed on the interior surface of the lid 101. As such, the MEMS microphone die 107 is in electronic communication with one or more devices mounted on the substrate layer 105 including, in this example, the electric contact pads 115 on the exterior surface of the MEMS microphone package 100.

In the example of FIG. 1C, the MEMS microphone die 107 is a monolithically integrated MEMS die, which includes both application specific integrated circuit (ASIC) components and the micro-mechanical electric microphone diaphragm within a single die. However, as shown in the example of FIG. 1E, the micro-mechanical electric microphone diaphragm and the ASIC components may be provided as separate integrated circuits. For example, as illustrated in FIG. 1E, the lid 101 is provided with both a MEMS microphone die 107' (that includes the micro-mechanical electric microphone diaphragm) and an ASIC 121. In other words, the MEMS microphone die 107' is mounted to the lid 101 adjacent to or over the acoustic input port 101, and the ASIC 121 is also mounted to the inner surface of the lid 101, adjacent to the MEMS microphone die 107'. In some examples, the ASIC 121 may be covered by an encapsulation (e.g. glob top). The MEMS microphone die 107' and the ASIC 121 may be mounted to the lid 101 by an adhesive or another fastening mechanism. The wires 117 electrically connect the MEMS microphone die 107' and the ASIC 121 to each other and to the substrate layer 105 (and consequently the electrical contact pads 115) when the cavity is sealed.

FIG. 1F is a cross-sectional view of another example of the top-ported MEMS microphone package 100 across line A-A of FIG. 1A. The lid 101 and the substrate layer 105 form the internal chamber for containing MEMS microphone die 107' and the ASIC 121 (which is used to control and drive the MEMS microphone die 107'). In other examples, the ASIC 121 and the MEMS microphone die 107' may be integrated within a single die (e.g. as in the example of FIG. 1C).

Figure 2A:
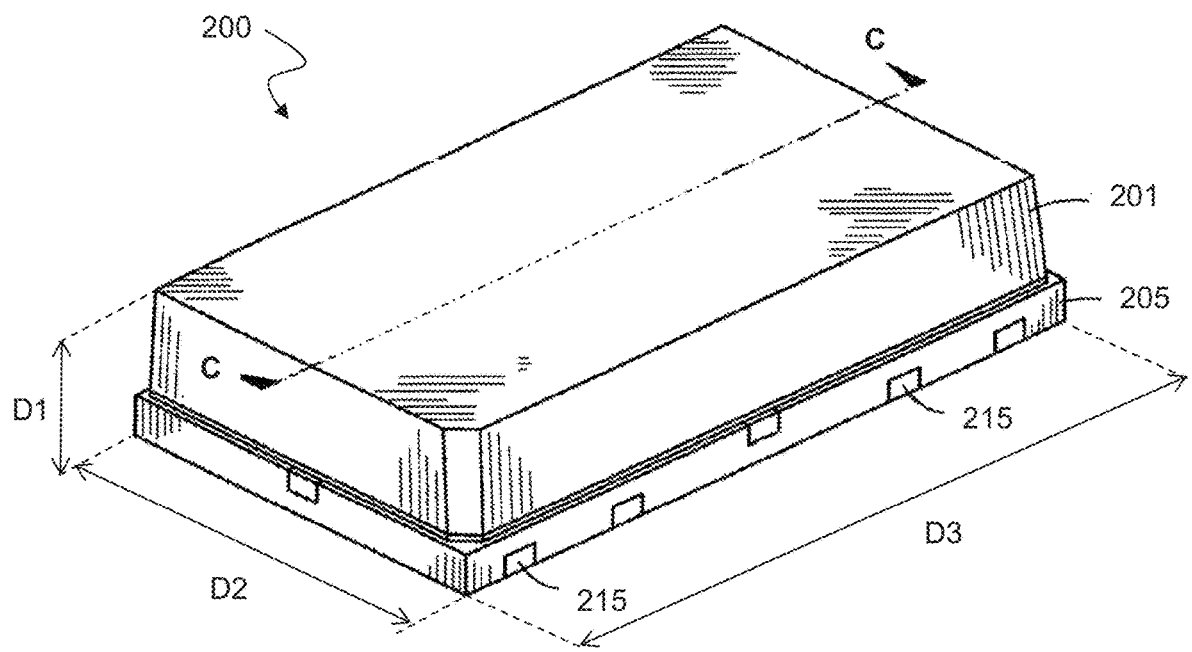
FIG. 2A schematically shows a top perspective view of a bottom-ported MEMS microphone package.
Figure 2B:
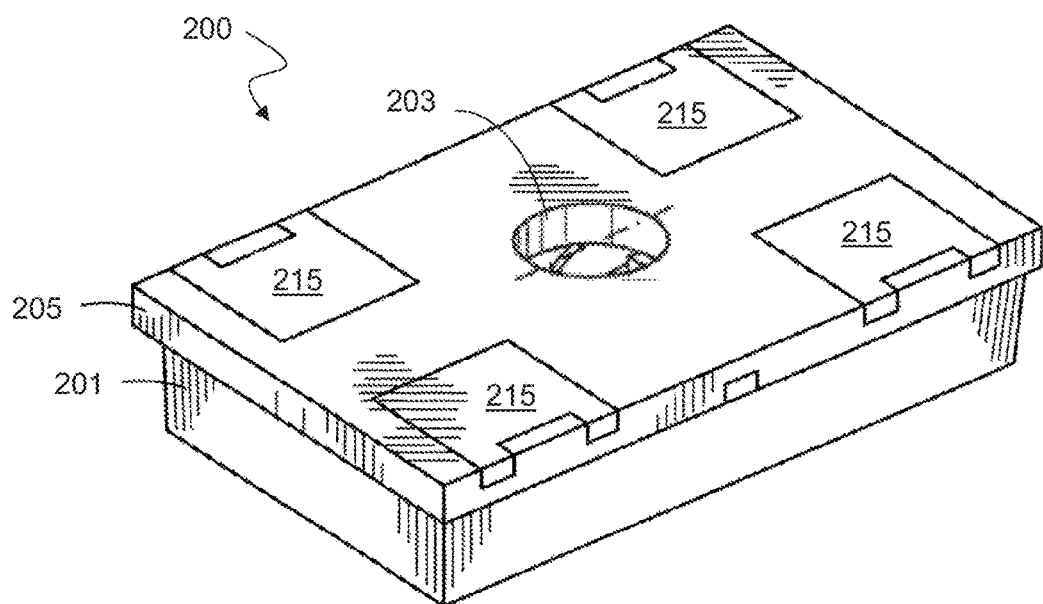
FIG. 2B schematically shows a bottom perspective view of the bottom-ported MEMS microphone package shown in FIG. 2A.
Figure 2C:
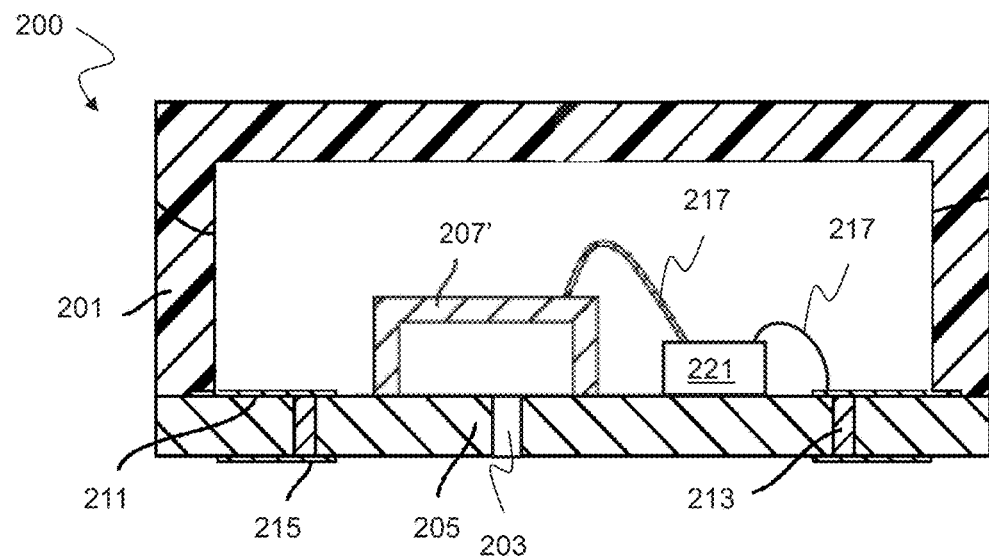
FIG. 2C schematically shows a cross-sectional view of the bottom-ported MEMS microphone package of FIG. 2A.

While FIGS. 1A to 1F show examples of a top-ported MEMS microphone package 100, some microphone packages position the acoustic input port 103 through the substrate layer 105 to form a bottom-ported MEMS microphone package 200, such as in the examples of FIGS. 2A to 2C. FIG. 2A schematically shows a top perspective view of a bottom-ported MEMS microphone package 200. In a corresponding manner, FIG. 2B schematically shows a bottom perspective view of the bottom-ported MEMS microphone package 200 shown in FIG. 2A. FIG. 2C schematically shows a cross-sectional view of the bottom-ported MEMS microphone package 200 of FIG. 2A across a line C-C. As depicted in FIG. 2A, the MEMS microphone package 200 may have a first dimension D1 (e.g. a thickness), a second dimension D2 (e.g. a depth), and a third dimension D3, which may be similar to the first dimension D1, the second dimension D2, and the third dimension D3, respectively, of the MEMS microphone package 100 shown in FIG. 1A.

Referring to FIGS. 2A and 2B, the MEMS microphone package 200 includes a lid component 201 as well as an acoustic input port 203 formed through a substrate layer 205. The lid 201 is coupled to (e.g. adhered to) the substrate layer 205 to form a sealed cavity. The substrate layer 205 may include similar materials as the substrate layer 105 described above in reference to FIGS. 1A to 1F. As illustrated in FIG. 2C, a MEMS microphone die 207' (including a micro-mechanical electric microphone diaphragm) is mounted to the substrate layer 205 adjacent to or covering the acoustic port opening 203 such that acoustic pressures (e.g., sound waves) entering the MEMS microphone package 200 through the acoustic input port 203 engage or interact with the MEMS microphone die 207 to produce an electrical signal that, with additional (exterior and/or interior) components (e.g., a speaker and accompanying circuitry), produce an output audible signal corresponding to the input acoustic pressures. The MEMS microphone die 207' may be mounted to the substrate layer 205 by an adhesive or another fastening mechanism known in the art. The lid 201 may be formed from one or more metals or another conductive material to shield the MEMS microphone die 207' from electromagnetic interference.

Circuit traces 211 on the substrate layer 205 are coupled to one or more conductive vias 213 which, in turn, are coupled to one or more electrical contact pads 215 on the bottom surface of the substrate 205. The electrical contact pads 215 on the bottom surface of the substrate 205 are also shown in the bottom perspective view of FIG. 2B. The electrical contact pads 215 may electrically connect the MEMS microphone package 200 to another substrate, such as a main board, a printed circuit board, or other electrical interconnect apparatus. The electrical contact pads 215, also referred to as package input/output (I/O) pads, may provide power and signal connections for the MEMS microphone package 200. Wires 217 couple an ASIC 221 (which is used to control and drive the MEMS microphone die 207') and the MEMS microphone die 207' to each other. Wires 217 also serve to couple the ASIC 221 to the circuit traces 211 on the substrate 205. In some examples, the ASIC 221 may be covered by an encapsulation (e.g. glob top). In other examples, the ASIC 221 and the MEMS microphone die 207' may be provided as a monolithically integrated MEMS die (e.g. as in the example of FIG. 1A).

It can be appreciated, from the general structure of the MEMS microphone packages 100 and 200 described above in reference to FIGS. 1A to 1F and 2A to 2C, that top-ported MEMS microphone packages and bottom-ported MEMS microphone packages require different bill of materials (BOMs) and process steps for their respective manufacture. In other words, the top-ported MEMS microphone package 100 and the bottom-ported MEMS microphone package 200 have different manufacturing steps, raw materials, subassemblies, intermediate assemblies, sub-components, parts, and the quantities of each needed to manufacture the resultant MEMS microphone package. For example, the top-ported MEMS microphone package 100 may require the use of two laminate substrates (e.g. one laminate substrate for substrate layer 105 and another laminate substrate for lid 101), while the bottom-ported MEMS microphone package 200 may require the use of one laminate substrate (e.g. for substrate layer 205) and one metal lid 201. Furthermore, a currently available MEMS microphone package is either top-ported or bottom-ported. In other words, the current market only offers single-package solutions that are either top-ported or bottom-ported.

Figure 3:
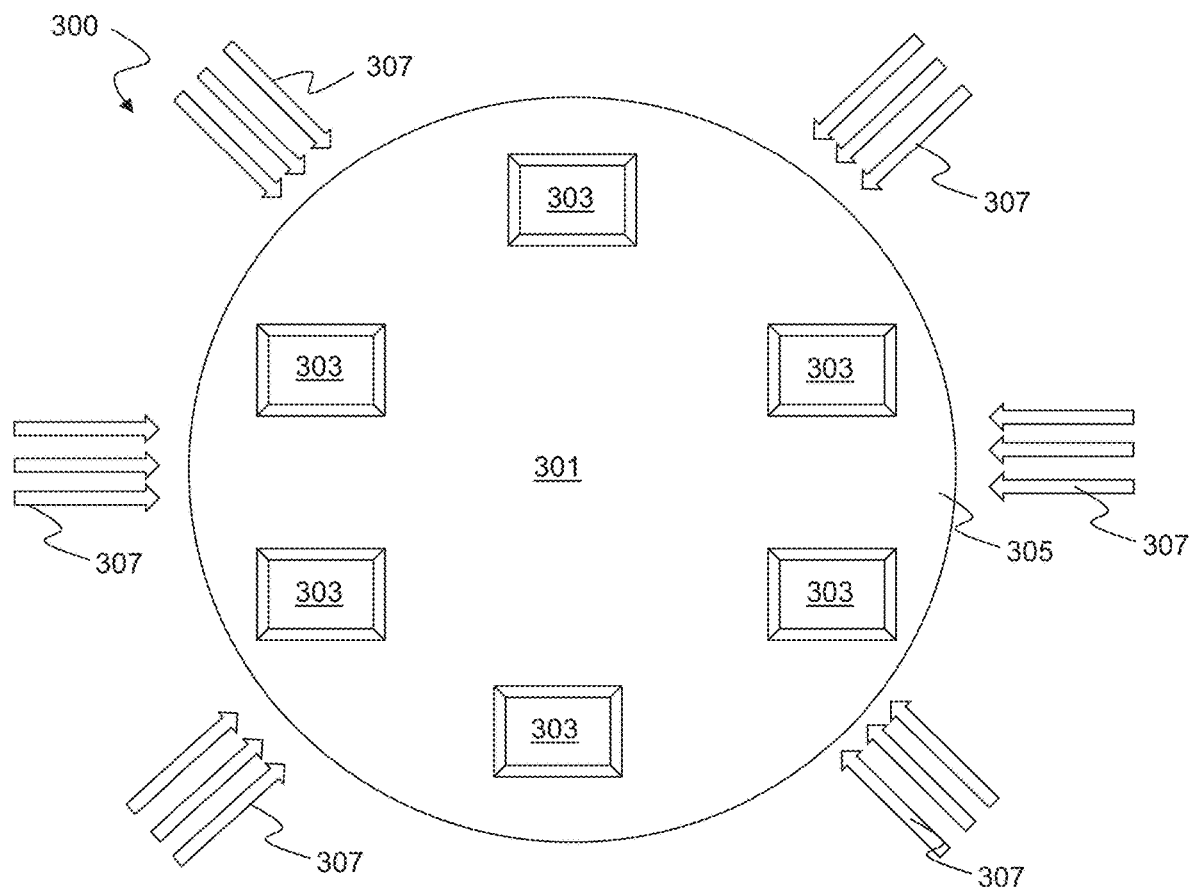
FIG. 3 shows a top-down view of a microphone array including a main board and a plurality of MEMS microphone packages disposed on the main board.

The currently available single-package solutions can complicate the manufacture of microphone arrays. FIG. 3 shows a top-down view of a microphone array 300 including a main board 301 (e.g. a PCB) and a plurality of MEMS microphone packages 303 disposed on (e.g. mounted on and electrically coupled to) the main board 301. The microphone array 300 may be used, for example, in a smart consumer product and/or for at least one of voice recognition, command capturing and recognition, or noise suppression. The example of FIG. 3 illustrates a circular array of MEMS microphone packages 303; however, it is noted that other spatial arrangements of the MEMS microphone packages 303 may be possible (e.g. linear array or matrix). Respective ones of the plurality of MEMS microphone packages 303 may be identified with either the top-ported MEMS microphone package 100 of FIG. 1A or the bottom-ported MEMS microphone package 200 of FIG. 2A. Stated differently, the plurality of MEMS microphone packages 303 of the microphone array 300 may all be top-ported MEMS microphone packages or may all be bottom-ported MEMS microphone packages or may be a mixture thereof. The use of top-ported MEMS microphone packages and/or bottom-ported MEMS microphone packages (that have different BOMs) in the microphone array 300 can result in complexity in manufacturing and set up, which consequently could increase manufacturing costs. This is especially true in examples where the plurality of MEMS microphone packages 303 includes a mixture of top-ported MEMS microphone packages and bottom-ported MEMS microphone packages (e.g. since different BOMs are required). Additionally, since the plurality of MEMS microphone packages 303 are mounted on the main board 301, the acoustic input port 103 of a top-ported MEMS microphone package may be directed away from a major surface 305 (e.g. top or upward-facing surface) of the main board 301, while the acoustic input port 203 of a bottom-ported MEMS microphone package may be directed towards the major surface 305 of the main board 301 (and may extend through a thickness of the main board 301). Consequently, the microphone array 300 of FIG. 3 may not be sufficiently sensitive to sound waves 307 that arrive laterally (e.g. sideways) at the plurality of MEMS microphone packages 303. Stated differently, the microphone array 300 of FIG. 3 may not adequately capture sound waves 307 that are incident on a sidewall of the lids 101, 201 of the plurality of MEMS microphone packages 303. A current solution to this scenario is the use of additional features (e.g. sound guides) to channel the sound waves 307 to the top surface and/or the bottom surface of the main board 301 in an effort to guide the sound waves 307 into the top-facing or bottom-facing acoustic input ports 103, 203 of the plurality of MEMS microphone packages 303 so as to enable the plurality of MEMS microphone packages 303 to detect the sound waves 307. However, such a solution further increases the costs and complexity associated with manufacturing the microphone array 300. Even further, since the microphone array 300 is generally produced at the board-level (e.g. by mounting the plurality of MEMS microphone packages 303 on the main board 301) and not at the package-level, the microphone array 300 generally occupies an area that may limit its implementation in mobile applications. In view of these observations, there may be a need for an improved MEMS microphone package that: (1) is compact in size (e.g. having a small package footprint); (2) has a standard BOM, while being easily configurable to be a top-ported MEMS microphone package, a bottom-ported MEMS microphone package, or a side-ported MEMS microphone package; (3) is modular in design so that it can easily be combined with other like MEMS microphone packages, at the package-level, to form a compact microphone array that may be suitable for mobile applications; and (4) is sensitive to sound waves travelling laterally (sideways) to the MEMS microphone package, without the use of additional features (e.g. sound guides).

FIGS. 4A to 4C and FIGS. 5A to 5F show a process flow illustrating a method of manufacturing a MEMS microphone package, in accordance with an embodiment. Example MEMS microphone packages that may be manufactured using the process flow of FIGS. 4A to 4C and FIGS. 5A to 5F are illustrated in FIGS. 7A, 7B, 8A, and 8B. The MEMS microphone packages may subsequently be used to conveniently and cheaply manufacture (in a modular manner and at the package-level) MEMS microphone arrays that are sensitive to sound waves travelling laterally. Example MEMS microphone arrays that may be manufactured using the MEMS microphone packages of FIGS. 7A, 7B, 8A, and 8B are shown in FIGS. 9A to 9E and 10A to 10E.

Figure 4A:
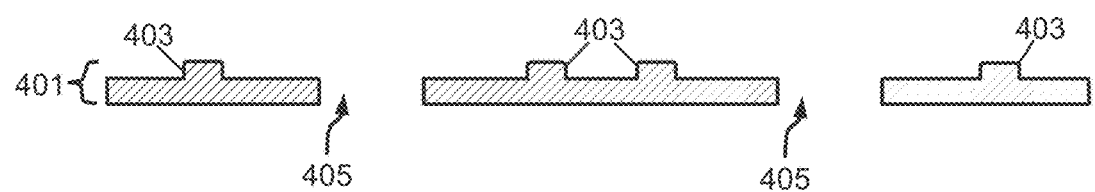
FIGS. 4A to 4C illustrate formation of a first portion of a MEMS microphone package, according to some embodiments.
Figure 4B:
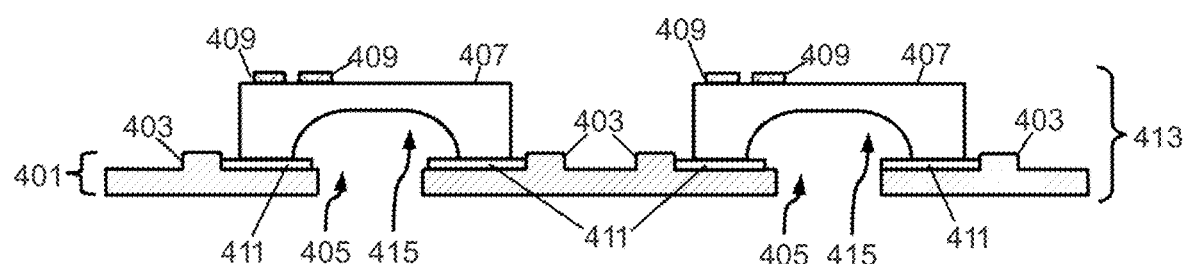
Figure 4C:
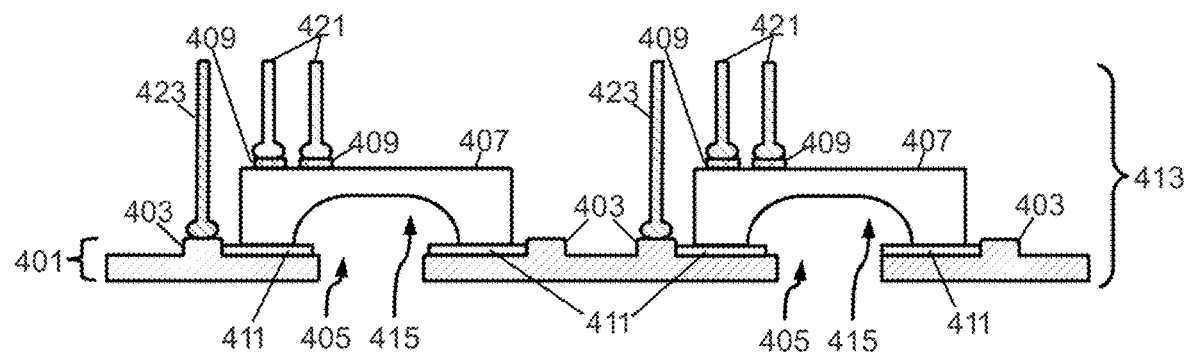

Referring first to FIGS. 4A to 4C, which illustrate formation of a first portion 413 of a MEMS microphone package according to some embodiments, FIG. 4A shows a frame 401 for a MEMS microphone package. The frame 401 includes portions that form one or more lids in an assembled MEMS microphone package (e.g. after singulation as described below). The frame 401 may have one or more ports 405 (e.g. that ultimately form acoustic input ports of the assembled MEMS microphone package) that extend through the frame 401. The frame 401 may also have bleed stop ridges 403 formed on one side of the frame 401. The bleed stop ridges 403 may be raised areas on the top surface of the frame 401, and each bleed stop ridge 403 may be formed to surround a respective port 405, and provide a physical barrier that prevents material applied to the top surface of the frame 401 from bleeding, or running outside of the bleed stop ridges 403.

In some embodiments, the frame 401 may be formed from a conductive material to provide electromagnetic interference (EMI) shielding for the assembled MEMS microphone package. In some embodiments, the frame 401 may be made from copper, gold, aluminum, or another metal or alloy, and may be formed by molding, by chemical or plasma etching, by milling, by stamping, or by another formation process. In other embodiments, the frame 401 may be made from a conductive material, such as a molding compound having conductive material disposed therein, or a conductive polymer such as an epoxy, molding compound, or the like.

FIG. 4B illustrates mounting of MEMS microphone dies 407 on the frame 401 to form the first portion 413 of the MEMS microphone package according to some embodiments. An adhesive 411 such as glue, epoxy, die-attach film (DAF), or the like, is deposited on the top surface of the frame 401 within the bleed stop ridges 403, which contain the adhesive 411. The bleed stop ridges 403 prevent the adhesive 411 from flowing between areas designated for different lids or packages. In some embodiments, MEMS microphone dies 407 are mounted on the adhesive 411 (that may be subsequently cured) so that the MEMS microphone dies 407 are affixed to the top surface of the frame 401. In some embodiments, each of the MEMS microphone dies 407 may be attached to the frame 401 spanning a respective port 405. Each of the MEMS microphone dies 407 may have a sensor cavity 415 or the like that acts as a front chamber or front volume for the respective MEMS microphone die 407.

FIG. 4C illustrates mounting of interconnects 421 and 423 on the first portion 413 of the shielded MEMS microphone package according to some embodiments. The interconnects 421 and 423 may include frame interconnects 423 that are mounted on and in electrical contact with the frame 401. In some embodiments, the frame interconnects 423 are mounted on the bleed stop ridges 403, or on another exposed portion of the frame 401, and may provide a ground connection for the frame 401 or lids. The interconnects 421 and 423 may also include die interconnects 421 that are mounted on die landing pads 409 disposed on a top side of the MEMS microphone dies 407. The interconnects 421 and 423 may be wirebond structures that are formed using a wirebond machine that forms a ball at the end of an exposed wire using, for example, an electric flame-off, and may weld, fuse or otherwise attach the ball end of the interconnect to the bleed stop ridges 403 and die landing pads 409 using, for example, heat, pressure, and/or ultrasonic vibration. After the ball end of the wire is attached to the contact pad 115, the wirebonding machine may cut the wire to form a second end of the interconnects 421 and 423. The interconnects 421 and 423 have a first end disposed on the frame 401 or on the MEMS microphone die 407, and extend away from the frame 401. Second ends of the interconnects 421 and 423 are opposite the first ends of the interconnects 421 and 423. In some embodiments, the second ends of the interconnects 421 and 423 are substantially level or coplanar to facilitate subsequent mounting of a substrate over the first portion 413. In other embodiments, the interconnects 421 and 423 are solder balls, solder balls with supporting structures, preformed structures that are placed on the contact pad, printed structures or structures that are formed in place on the frame 401 or die landing pads 409.

Figure 5A:
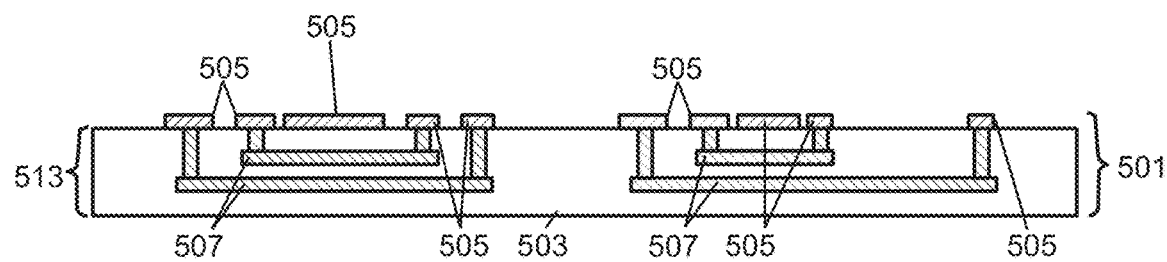
FIGS. 5A to 5F illustrate formation of a second portion of a MEMS microphone package, according to some embodiments.

Referring now to FIGS. 5A to 5F, which illustrate the formation of a second portion of the MEMS microphone package according to some embodiments. FIG. 5A shows a second portion 501 of the shielded MEMS microphone package, the second portion 501 having one or more pads 505 (e.g. landing pads) disposed at a major surface of a substrate 513 (e.g. a PCB). The one or more pads 505 may be interconnected by one or more metal lines and/or vias 507 on the substrate 513 or in a substrate body 503. It is noted that the one or more metal lines and/or vias 507 may be configured to provide power and signal connections for the assembled MEMS microphone package.

Figure 5B:
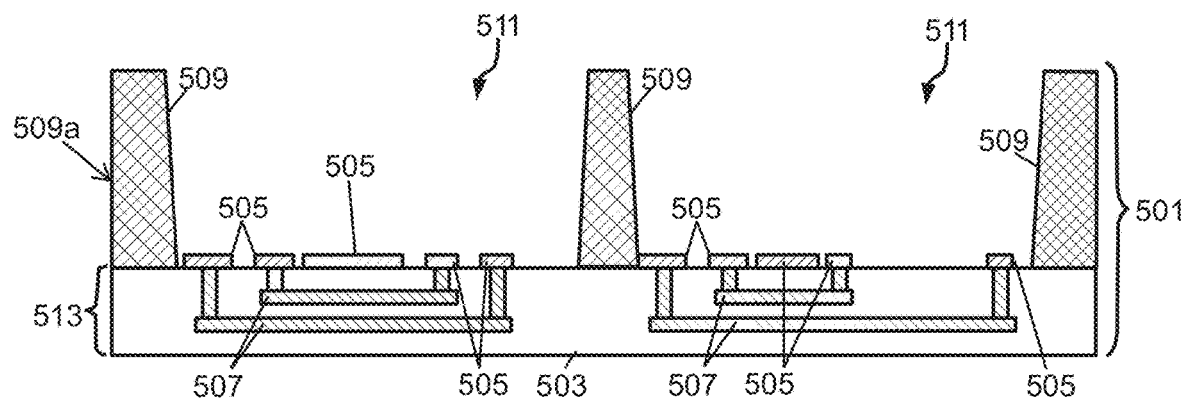

FIG. 5B illustrates formation of sidewalls 509 on the second portion 501 according to some embodiments. In some embodiments, the sidewalls 509 are formed on the substrate body 503, and in other embodiments, the sidewalls 509 may be formed on a stopper pad, oxide or sealing layer, or the like, that is disposed on a surface of the substrate 513. In some embodiments, the sidewalls 509 are formed from a molding compound that is amenable to a plating process. For example, the sidewalls 509 may include an elastomer molding compound material, and an outer surface 509a of the sidewalls 509 may subsequently be plated with a conductive material (e.g. copper) to form electrical contact pads (also referred to as package input/output (I/O) pads) that provide power and signal connections for the assembled MEMS microphone package and that are electrically coupled to the one or more metal lines and/or vias 507 disposed in the substrate body 503. This step is described in greater detail in FIGS. 6D and 6E. The sidewall 509 may be formed by molding the sidewall in place, by 3D printing, by preforming the sidewall 509 and attaching the sidewall 509 to the substrate 513, or another forming process. The sidewall 509 is formed to contiguously surround a die area and one or more of the pads 505, and extend away from the substrate 513 to provide the interior cavities 511.

Figure 5C:
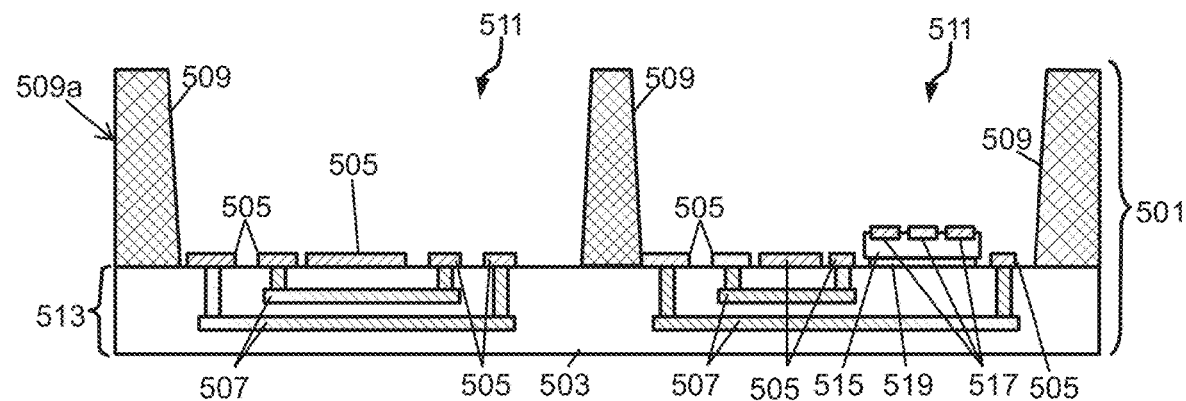
Figure 5D:
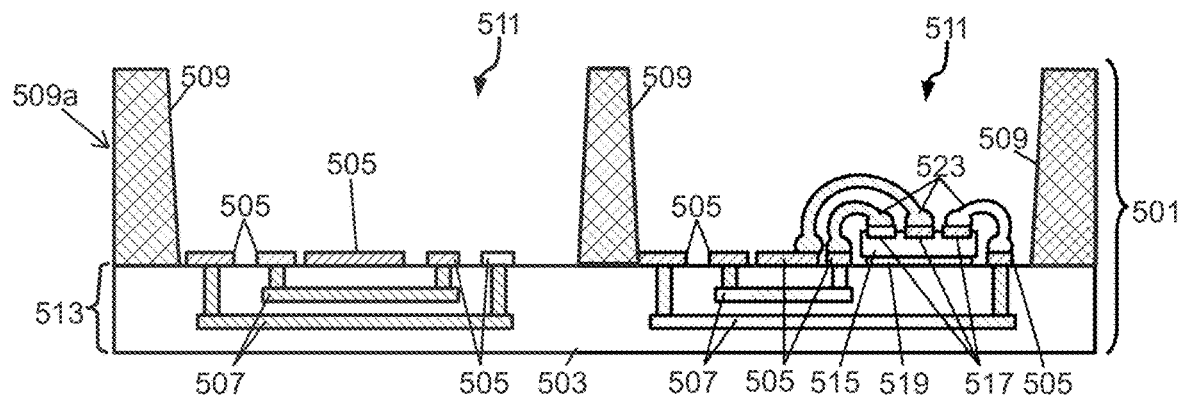

FIG. 5C illustrates attachment of a control chip 515 according to some embodiments. The control chip 515 may be an ASIC, communications device, an interface device, or the like, and may have circuitry that controls, or reads the MEMS microphone die 407. The control chip 515 is attached to the substrate 513 by a die attachment structure 519 such as DAF, adhesive, tape, or the like. In other embodiments, the control chip 515 is attached to the substrate 513 with a mechanical retainer such as a clip, socket, screw, or the like. The control chip 515 has one or more control chip bond pads 517 disposed on a top side that faces away from the substrate 513. FIG. 5D illustrates wirebonding of the control chip 515 to one or more pads 505 according to some embodiments. In some embodiments, the control chip 515 is a wirebonded control chip and is electrically connected to one or more of the pads 505 using wirebond connections 523. While FIGS. 5C and 5D illustrate that the control chip 515 may be wirebonded to the substrate 513, pad mounted control chips (such as in the example of FIG. 5E) are also possible.

Figure 5E:
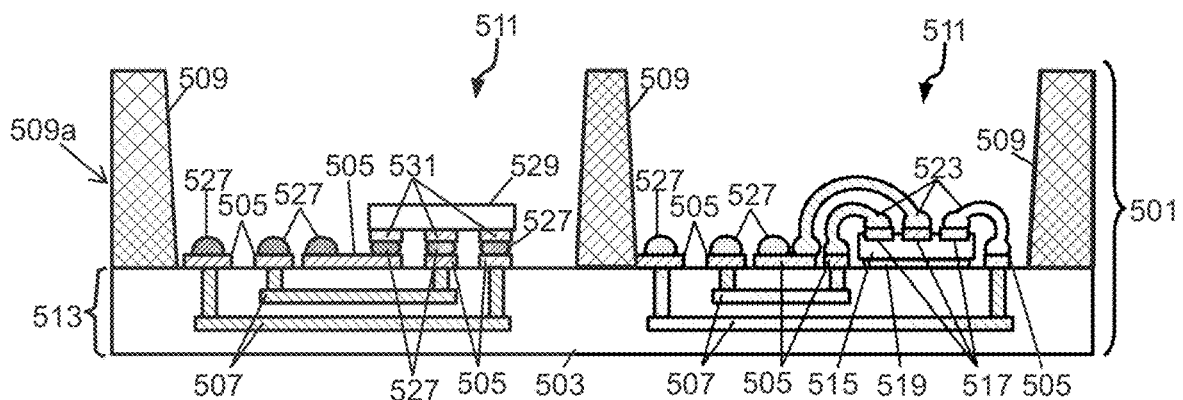
Figure 5F:
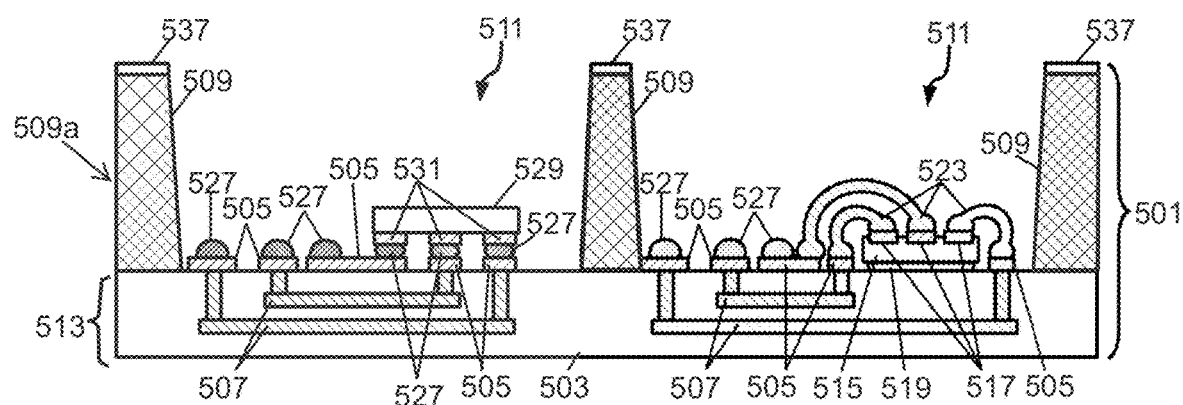

FIG. 5E illustrates attachment of a pad mounted control chip 529 according to some embodiments. Conductive connectors 527 may be applied to one or more of the pads 505. In some embodiments, a package includes a control chip 529 mounted by mounting pads 531 disposed on a bottom side of the control chip 529. The pad mounted control chip 529 is attached to pads 505 by the conductive connectors 527. The pad mounted control chip 529 may be an ASIC, communications device, an interface device, or the like, and may have circuitry that controls, or reads the MEMS microphone die 407. While the second portion 501 of the shielded sensor package illustrated in FIG. 5E is shown with a wirebonded control chip 515 and a pad mounted control chip 529, the different types of control chips 515 and 529 are shown purely for illustrative purposes, and is not intended to be limiting. FIG. 5F illustrates application of a lid connector 537 to the sidewalls 509 according to some embodiments. The lid connector is disposed on second ends of the sidewalls 509, and may be a glue, DAF, epoxy, or another adhesive or attachment structure.

Figure 6A:
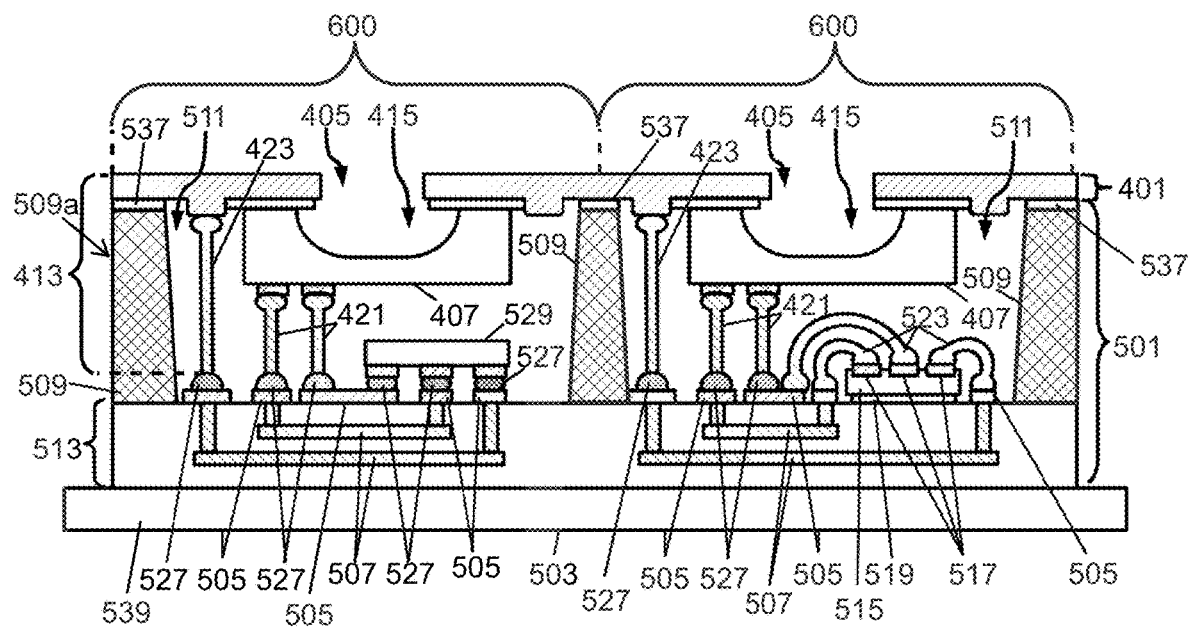
FIGS. 6A to 6E illustrate assembly of a MEMS microphone package using the first portion obtained from FIGS. 4A to 4C and the second portion obtained from FIGS. 5A to 5F, according to some embodiments.

FIGS. 6A to 6E illustrate assembly of shielded MEMS microphone packages 600, according to some embodiments. FIG. 6A illustrates attachment of the first portion 413 of FIG. 4C to the second portion 501 of FIG. 5F. The first portion 413 is inverted and affixed to the second portion 501 by the lid connectors 537 to enclose the interior cavity 511. Additionally, the interconnects 421 and 423 are attached to the pads 505 of the second portion and affixed by the conductive connectors 527. In some embodiments, the top surfaces of the pads 505 are substantially level so that the ends of the interconnects 421 and 423 make consistent contact with respective pads 505. In some embodiments, each of the interconnects 421 and 423 extends from the first portion 413 of the shielded MEMS microphone package 600 so that a second end of each of the interconnects 421 and 423 is in electrical contact with a different contact pad 505 on the surface of the substrate 513. In other embodiments, one or more of the interconnects 421 and 423 contacts a control chip bond pad 517, or another landing pad, contact pad, or the like. Thus, the MEMS microphone die 407 may be connected to a respective control chip 515 and 529 by way of the sensor interconnects 421 while the MEMS microphone die 407 and respective control chip 515 and 529 are spaced apart and overlapping each other. The spatial overlap of the MEMS microphone die 407 and the respective control chip 515 and 529 achieves a compact package footprint. As illustrated in FIG. 6A and with respect to interconnects 421, one end of an interconnect 421 is attached to a die landing pad 409 of the MEMS microphone die 407, with the interconnect 421 extending away from the die landing pad 409. The other end of the interconnect 421 will then be in contact (e.g. electrical and/or physical contact) with the landing pad 505 on the substrate 531, with the landing pad 505 being electrically connected to the one or more metal lines and/or vias 507 disposed in the substrate body 503.

The sidewalls 509 and frame 401 form a conductive shell providing EMI shielding for the enclosed control chips 515 and 529 and MEMS microphone dies 407. In some embodiments, the substrate 513 also has a shielding layer (not shown), increasing the EMI shielding of the MEMS microphone packages 600. Additionally, in the arrangement illustrated, the interior cavity 511 acts as a back volume for the MEMS microphone dies 407, while the sensor cavity 415 acts as front volume. After the first portion 413 is mounted on the second portion 501, the packages 60000 may be cured, reflowed, or the like to set, cure, or reflow the lid connectors 537 and conductive connectors 527. The MEMS microphone packages 60000 may also be mounted on a carrier 539 such as a tape or the like.

Figure 6B:
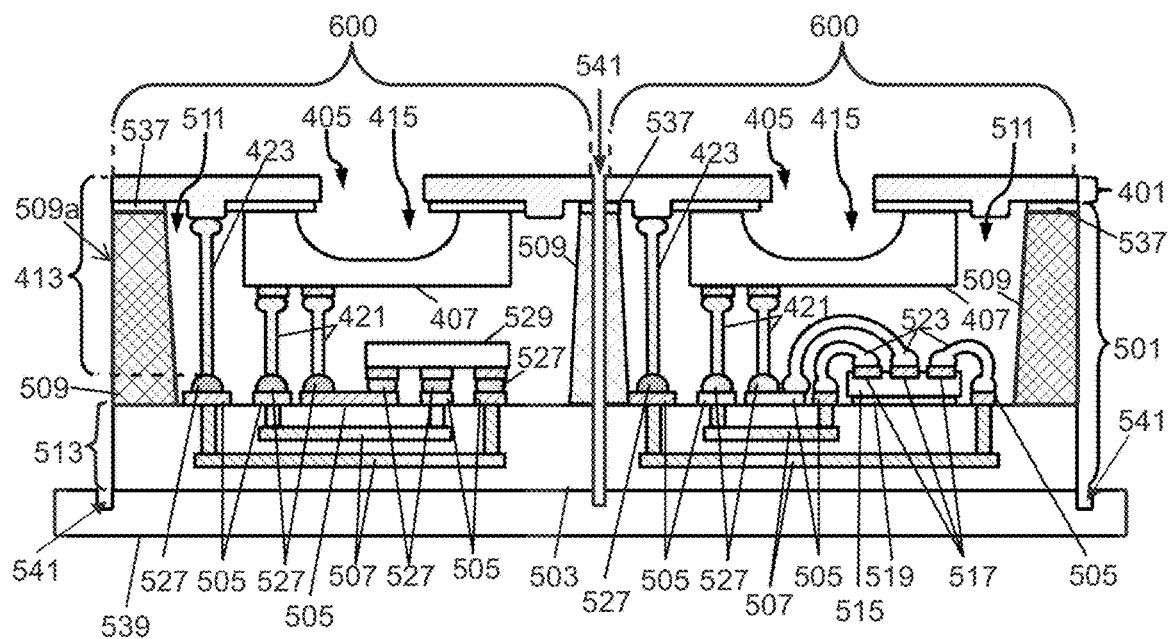

FIG. 6B illustrates singulation of the MEMS microphone packages 60000 according to some embodiments. The MEMS microphone packages 60000 are cut, for example, by die sawing, laser cutting, or the like, to form cut region 541 and separate the individual packages 60000 while maintaining the MEMS microphone packages 600 on the carrier 539. It is noted that while the example of FIG. 6B shows singulation to form individual packages 600, where each MEMS microphone package 60000 includes a single MEMS microphone die 407, the singulation process of FIG. 6B may be adapted or modified so that the structure of FIG. 6A is singulated to form individual packages 602 (e.g. a single package 602 shown in FIG. 6C), where each MEMS microphone package 602 includes a plurality of MEMS microphone dies 407 (e.g. two MEMS microphone dies 407 in the example of FIG. 6C).

As discussed above in reference to FIG. 5B, the sidewalls 509 may include an elastomer molding compound material, and the outer surface 5o9a of the sidewalls 509 may subsequently be plated with a conductive material (e.g. copper) to form electrical contact pads (also referred to as package input/output (I/O) pads) that provide power and signal connections for the MEMS microphone package 60000 and that are electrically coupled to the one or more metal lines and/or vias 507 disposed in the substrate body 503. As shown in FIG. 6D, each singulated MEMS microphone package 600 of FIG. 6B may be picked from the carrier 539 and repositioned onto a carrier 539' such that a first outer surface 509a1 of the sidewalls 509 of each singulated MEMS microphone package 600 is in contact (e.g. physical contact) with and attached to the carrier 539', while a second outer surface 509a2 of the sidewalls 509 is upward-facing and directed away from the carrier 539'. Only one MEMS microphone package 600 is shown in FIG. 6D for the sake of simplicity.

Figure 6C:
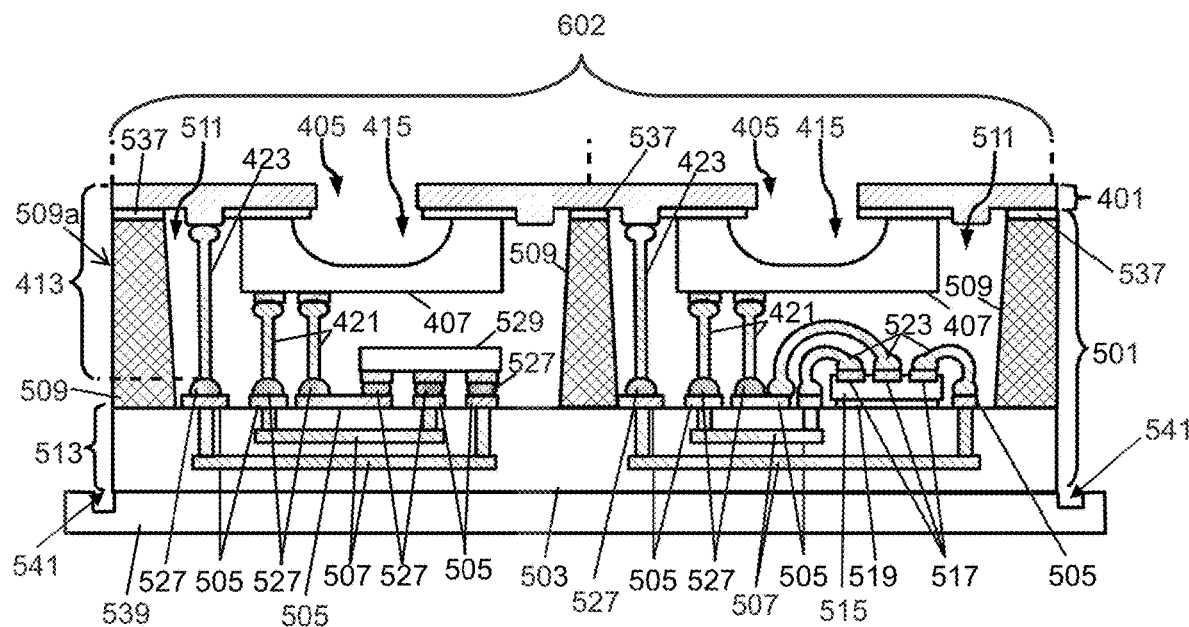
Figure 6D:
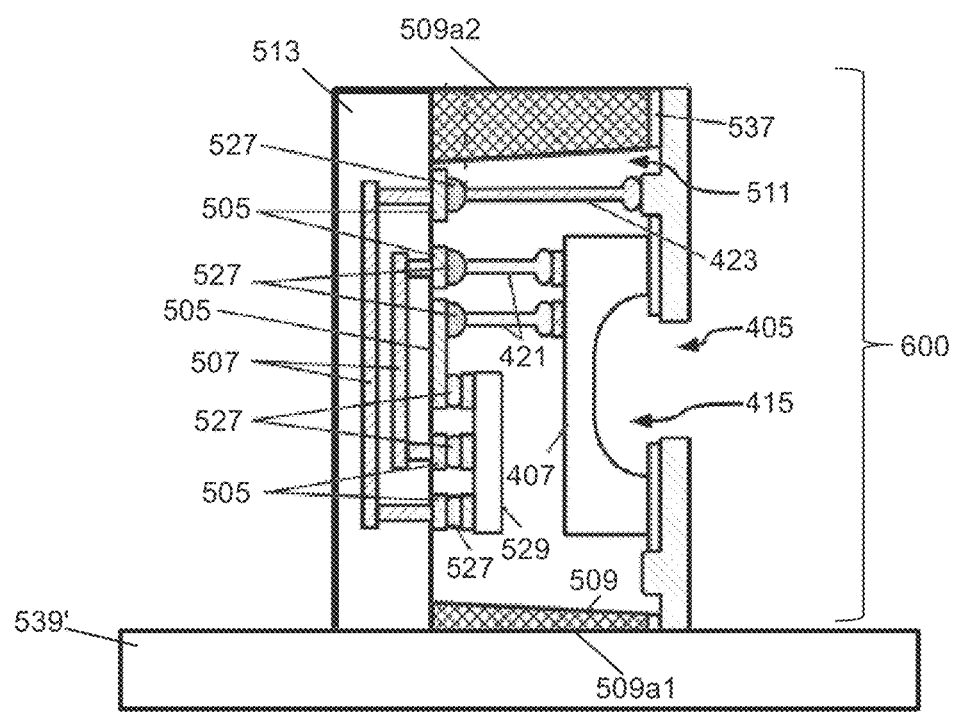
Figure 6E:
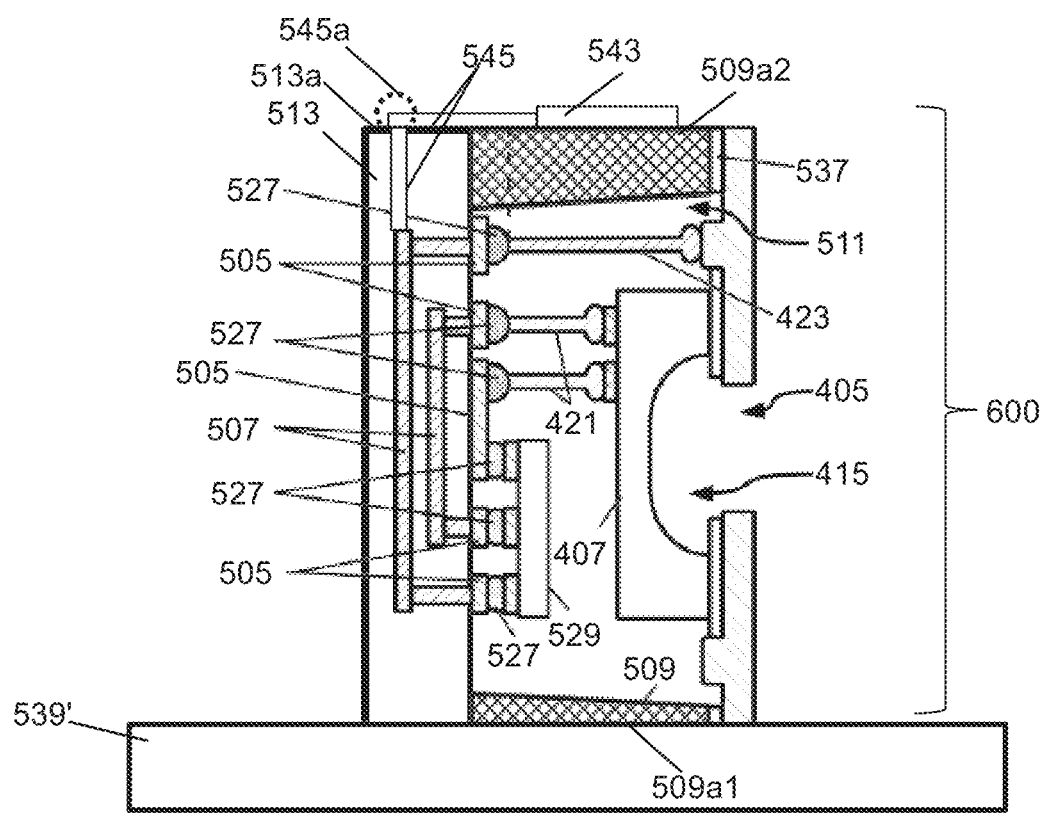

As shown in FIG. 6E, a plating and etching process known in the art may be carried out on the second outer surface 509a2 of the sidewalls 509 such that electrical contact pads 543 (also referred to as package input/output (I/O) pads) and traces 545 are formed at the second outer surface 509a2 of the sidewalls 509. The traces 545 are electrically and/or physically coupled to the electrical contact pads 543, with the traces 545 having terminal portions 545a that are formed at the surface 513a of the substrate 513 that is adjacent to the second outer surface 509a2 of the sidewalls 509. As illustrated in FIG. 6E, the traces 545 also extend into at least a portion of the substrate 513 so as to electrically couple the electrical contact pads 543 and the one or more metal lines and/or vias 507 to each other. In some embodiments, an angle subtended between the portion of the trace 545 extending into the substrate 513 and the portion of the trace 545 disposed at the surface 513a of the substrate 513 may be about 90 degrees. Each singulated MEMS microphone package 60000 may subsequently be removed from the carrier 539'.

Figure 7A:
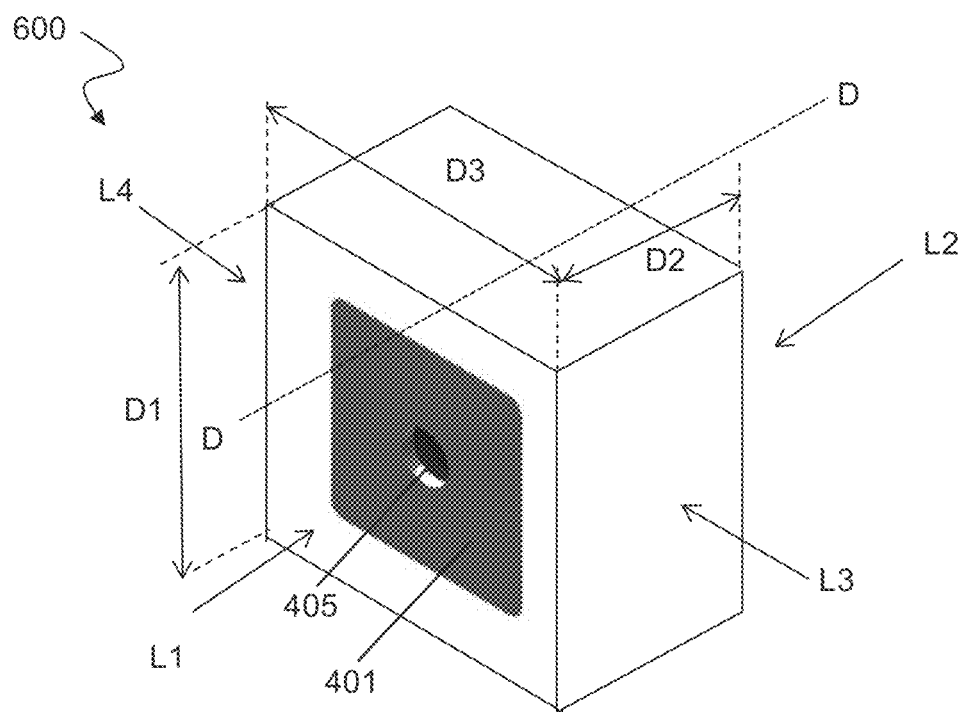
FIGS. 7A and 8A schematically show a top isometric view of a MEMS microphone package formed using the process shown in FIGS. 4A to 4C, FIGS. 5A to 5F, and 6A to 6E, according to some embodiments.
Figure 7B:
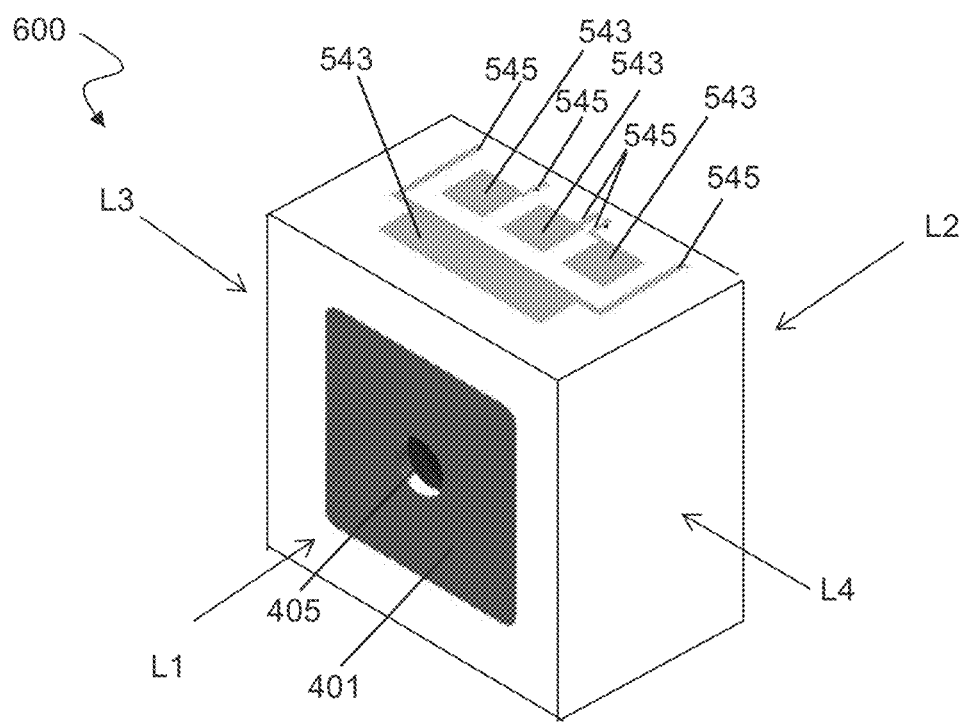
FIGS. 7B and 8B schematically show a bottom isometric view of the MEMS microphone package shown in FIGS. 7A and 8A, respectively, according to some embodiments.
Figure 7C:
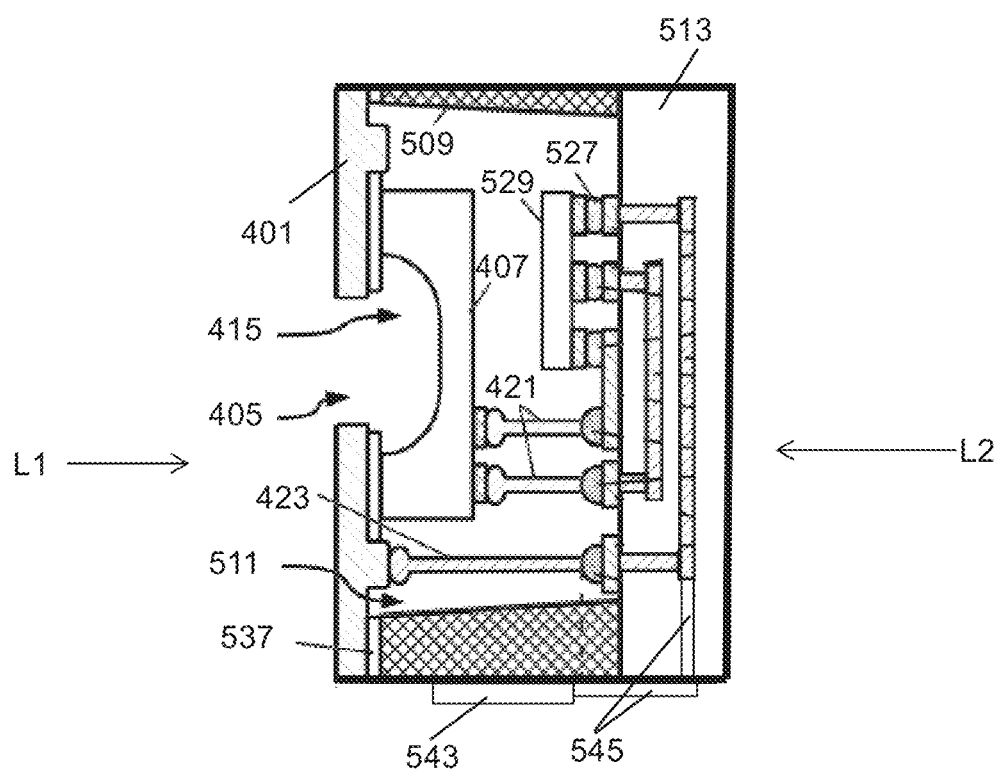
FIG. 7C schematically shows a cross-sectional view of the MEMS microphone package of FIG. 7A, according to some embodiments.

FIG. 7A schematically shows a top isometric view of the assembled MEMS microphone package 60000 formed using the process shown in FIGS. 4A to 4C, FIGS. 5A to 5F, and 6A to 6E, according to some embodiments. FIG. 7B schematically shows a bottom isometric view of the MEMS microphone package 60000 shown in FIG. 7A and illustrates, in greater detail, the electrical contact pads 543 and traces 545 formed at the bottom surface of the MEMS microphone package 600. FIG. 7C schematically shows a cross-sectional view of the MEMS microphone package of FIG. 7A along a line D-D. The MEMS microphone package 600 of FIGS. 7A to 7C includes a single MEMS microphone that has a single acoustic input port 405 and lid 401 located at a first lateral side L1 (e.g. sidewall) of the MEMS microphone package 600. A second lateral side L2 of the MEMS microphone package 600 (opposite the first lateral side L1) may be formed by an exposed surface of the substrate 513. A third lateral side L3 and a fourth lateral side L4 of the MEMS microphone package 600 may be formed by the molding compound of sidewalls 509. Consequently, the MEMS microphone package 600 depicted in FIGS. 7A and 7B forms a single MEMS microphone having one side-port located on one side (e.g. lateral side L1) of the package 600. Stated differently, the MEMS microphone package 600 depicted in FIGS. 7A and 7B forms a single silicon microphone having one sound port located at one sidewall of the package 600. As illustrated in FIG. 7A, the MEMS microphone package 600 may have a first dimension D1 (e.g. a thickness) of about 2 mm, a second dimension D2 (e.g. a depth) of about 1 mm, and a third dimension D3 (e.g. a width) of about 2 mm, thus resulting in a compact package footprint (e.g. in comparison with the examples of FIGS. 1A and 2A). As such, the assembled MEMS microphone package 600 (and the method of its manufacture) achieves the following advantages: (1) being compact in size (e.g. having a small package footprint); (2) having a standard BOM, while being easily configurable to be a top-ported MEMS microphone package, a bottom-ported MEMS microphone package, or a side-ported MEMS microphone package; and (3) being sensitive to sound waves travelling laterally (sideways) to the MEMS microphone package, without the use of additional features (e.g. sound guides).

Figure 8A:
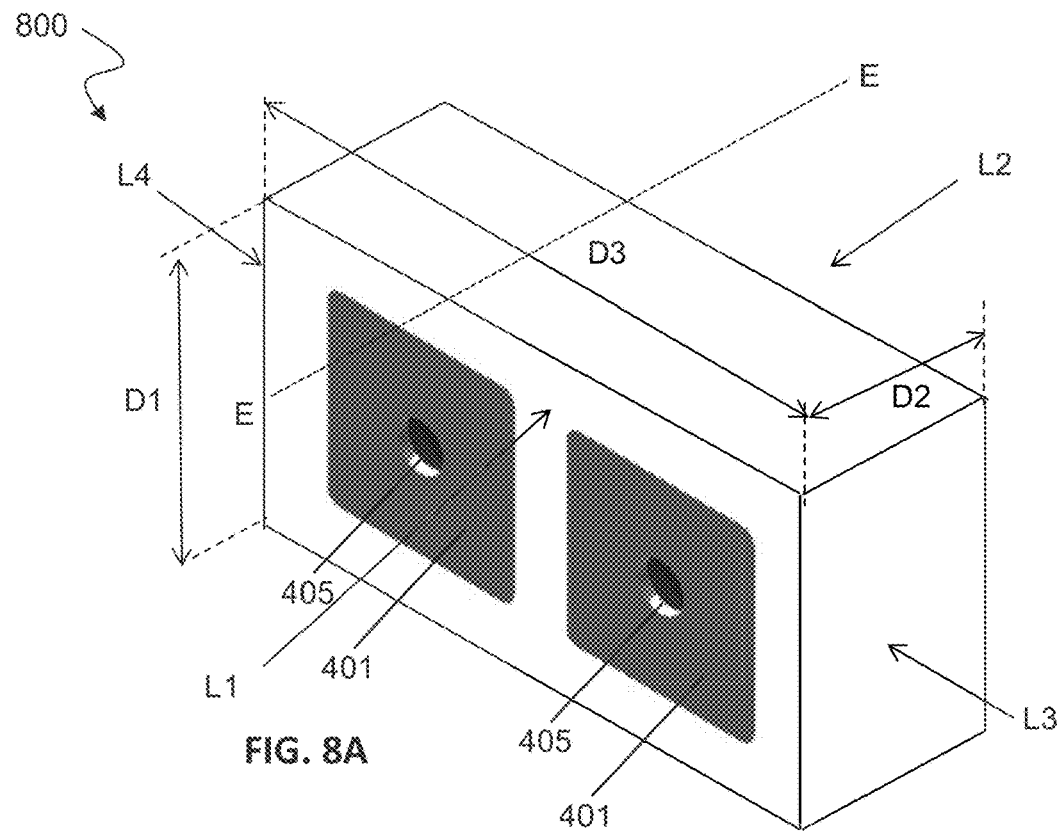
Figure 8B:
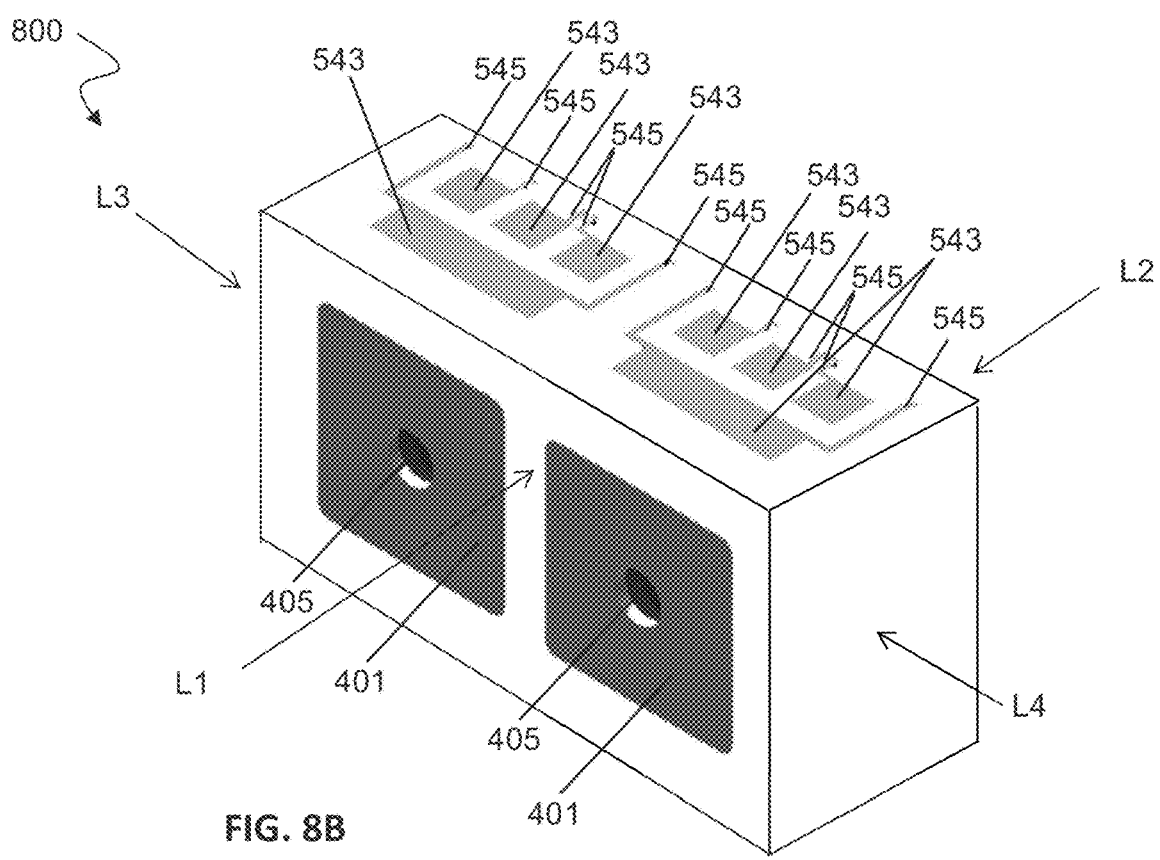

As discussed above, the singulation process of FIG. 6B may be adapted or modified so that the structure of FIG. 6A is singulated to form individual packages 602 (e.g. single package 602 shown in FIG. 6C), where each MEMS microphone package 602 includes a plurality of MEMS microphone dies 407 (e.g. two MEMS microphone dies 407 in the example of FIG. 6C). FIGS. 8A and 8B show such an example, where FIG. 8A schematically shows a top isometric view of the assembled MEMS microphone package 80000 having two microphones and where FIG. 8B schematically shows a bottom isometric view of the MEMS microphone package 800 shown in FIG. 8A. FIG. 8B also illustrates, in greater detail, the electrical contact pads 543 and traces 545 formed at the bottom surface of the MEMS microphone package 800.

The MEMS microphone package 800 of FIGS. 8A and 8B includes two MEMS microphones and two acoustic input ports 405 located at a first lateral side L1 of the MEMS microphone package 800. A third lateral side L3 and a fourth lateral side L4 of the MEMS microphone package 80000 may be formed by the molding compound of sidewalls 509. A second lateral side L2 (which is opposite the first lateral side L1) of the MEMS microphone package 800 may be formed by an exposed surface of the substrate 513 (it is noted that a cross-sectional view along line E-E of FIG. 8A looks similar to FIG. 7C). Consequently, the MEMS microphone package 800 depicted in FIGS. 8A and 8B forms a microphone array having two MEMS microphones and two side-ports located on one side (e.g. lateral side L1) of the package 800. Stated differently, the MEMS microphone package 800 depicted in FIGS. 8A and 8B forms a microphone array (at the package level and not at the board level) having two sound ports located at one sidewall of the microphone package 800. As illustrated in FIG. 8A, the MEMS microphone package 800 may have a first dimension D1 (e.g. a thickness) of about 2 mm, a second dimension D2 (e.g. a depth) of about 1 mm, and a third dimension D3 (e.g. a width) of about 4 mm, thus resulting in a compact microphone array footprint (e.g. in comparison with the example of FIG. 3). As such, the assembled MEMS microphone package 800 (and the method of its manufacture) achieves the following advantages: (1) being compact in size (e.g. having a small package footprint); (2) having a standard BOM, while being easily configurable to be a top-ported MEMS microphone package, a bottom-ported MEMS microphone package, or a side-ported MEMS microphone package; (3) being modular in design so that it can easily be combined with other like MEMS microphone packages, at the package-level, to form a compact microphone array that may be suitable for mobile applications; and (4) being sensitive to sound waves travelling laterally (sideways) to the MEMS microphone package, without the use of additional features (e.g. sound guides).

Figure 9A:
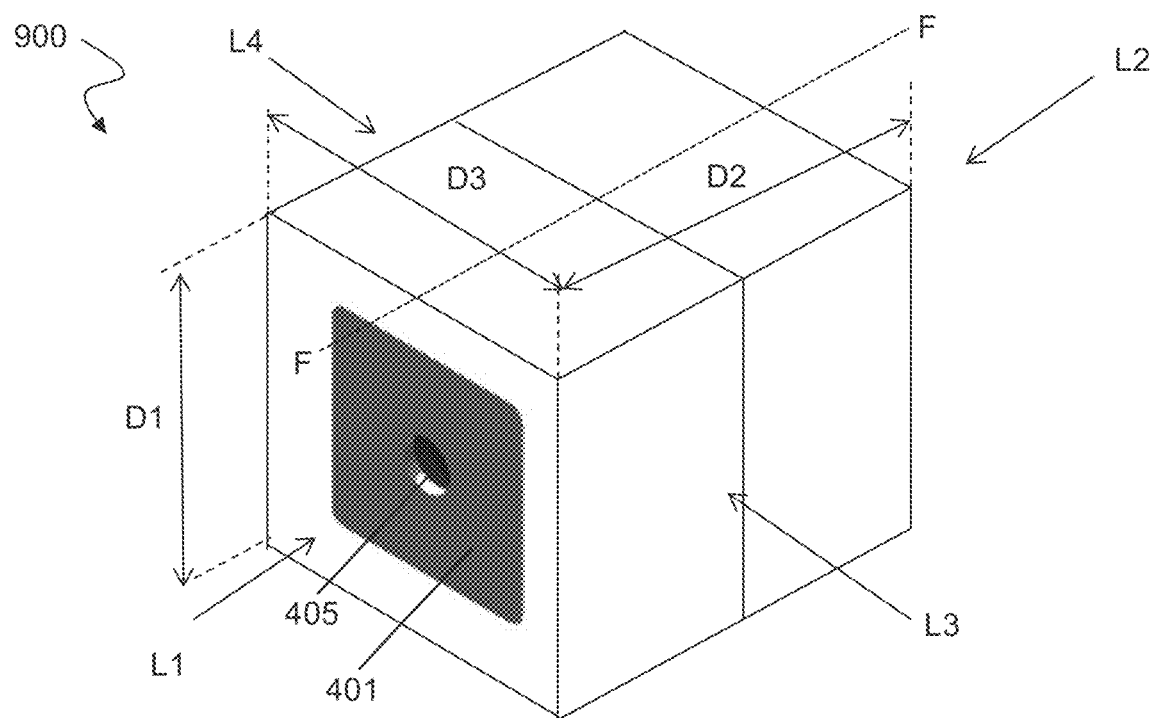
FIGS. 9A to 9E and 10A to 10E schematically show various views of a MEMS microphone array, according to some embodiments.
Figure 9B:
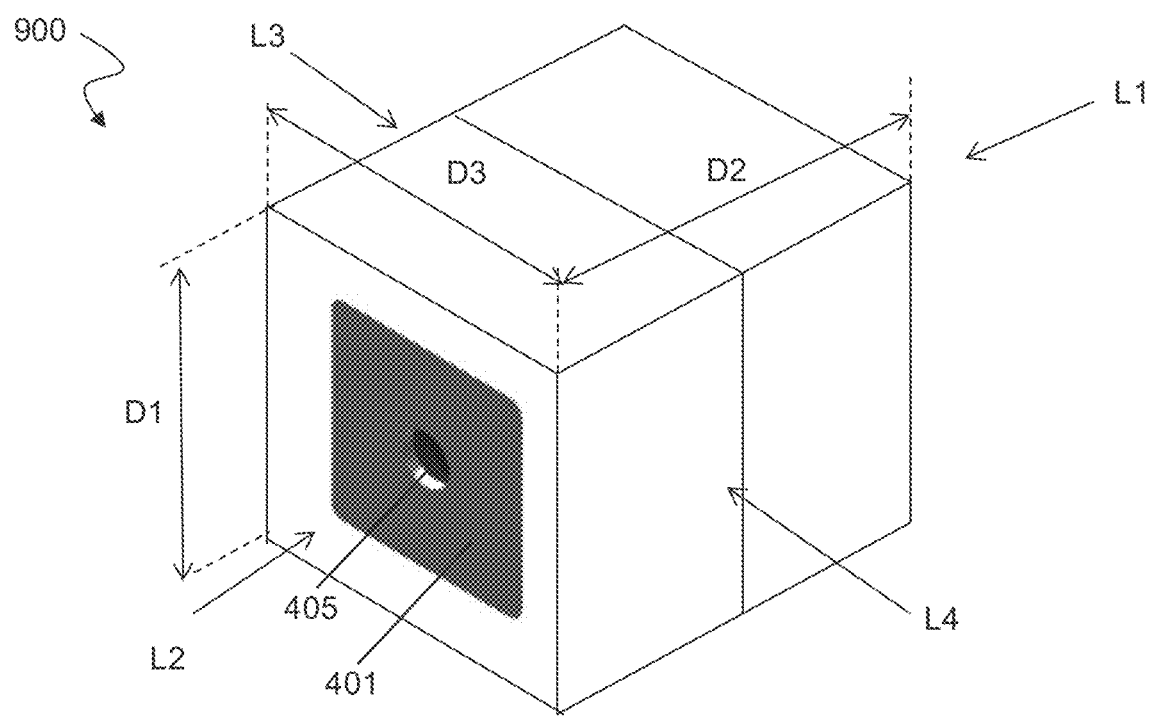
Figure 9C:
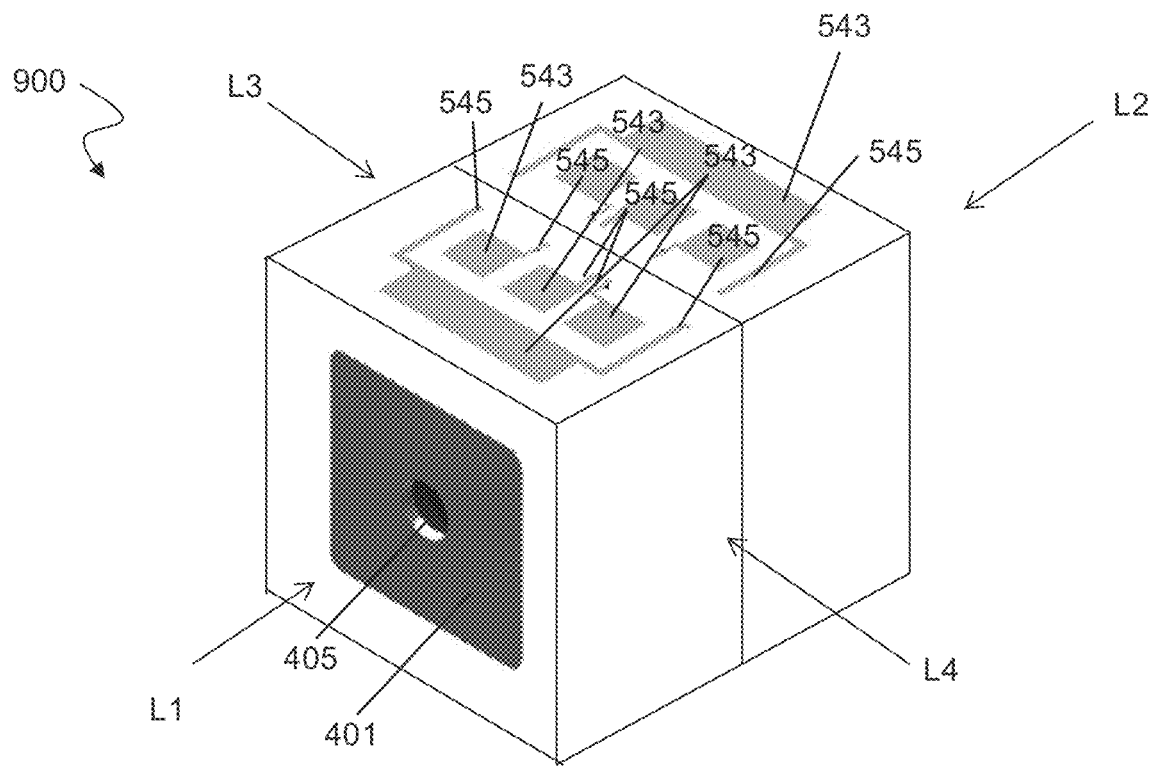
Figure 9D:
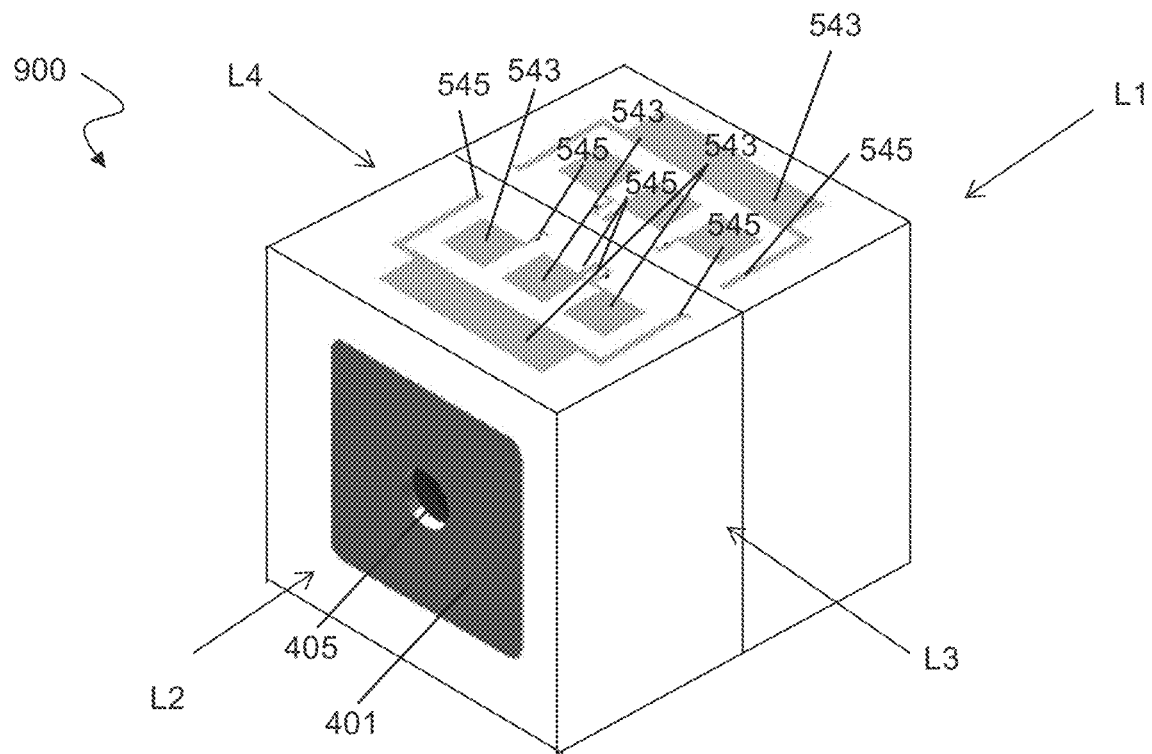
Figure 9E:
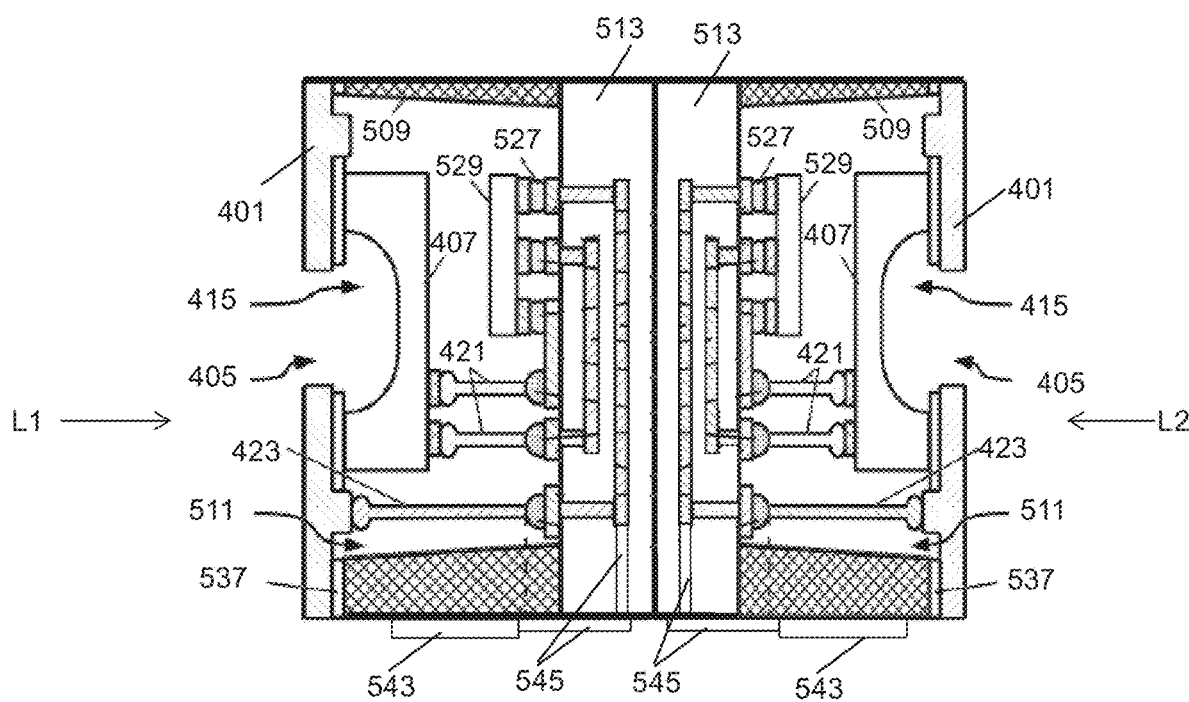

The single MEMS microphone package 600 of FIGS. 7A and 7B may be combined with another MEMS microphone package 600 to form a dual-side sound port microphone array, as shown in FIGS. 9A to 9E. FIGS. 9A and 9B schematically shows top isometric views of a MEMS microphone package 900 having two microphones; FIGS. 9C and 9D schematically show bottom isometric views of the MEMS microphone package 900 shown in FIGS. 9A and 9B, respectively. Additionally, FIG. 9E shows a cross-sectional view of the MEMS microphone package 900 across line F-F of FIG. 9A. As shown in FIG. 9E, the MEMS microphone package 900 may be formed by bonding (e.g. by an adhesive) the substrates 513 of two MEMS microphone packages 600 to each other, thereby forming a dual-side sound port microphone array. In other words, the resultant microphone array shown in FIGS. 9A to 9E has a stereo configuration.

The MEMS microphone package 900 of FIGS. 9A to 9E includes one MEMS microphone and one acoustic input port 405 located at each of a first lateral side L1 and a second lateral side L2 of the MEMS microphone package 900. A third lateral side L3 and a fourth lateral side L4 of the MEMS microphone package 80000 may be formed by the molding compound of sidewalls 509. Consequently, the MEMS microphone package 900 depicted in FIGS. 9A to 9E forms a microphone array having a first MEMS microphone and side-port 901 located opposite to a second MEMS microphone and side-port 903. Stated differently, the MEMS microphone package 900 depicted in FIGS. 9A to 9E forms a microphone array (at the package level and not at the board level) having two sound ports 405 located at opposite sides of the package 900 in relation to each other. As illustrated in FIG. 9A, the MEMS microphone package 80000 may have a first dimension D1 (e.g. a thickness) of about 2 mm, a second dimension D2 (e.g. a depth) of about 2.5 mm, and a third dimension D3 (e.g. a width) of about 2 mm, thus resulting in a compact microphone array footprint (e.g. in comparison with the example of FIG. 3). As such, the assembled MEMS microphone package 900 (and the method of its manufacture) achieves the following advantages: (1) being compact in size (e.g. having a small package footprint); (2) having a standard BOM, while being easily configurable to be a top-ported MEMS microphone package, a bottom-ported MEMS microphone package, or a side-ported MEMS microphone package; (3) being modular in design so that it can easily be combined with other like MEMS microphone packages, at the package-level, to form a compact microphone array that may be suitable for mobile applications; and (4) being sensitive to sound waves travelling laterally (sideways) to the MEMS microphone package, without the use of additional features (e.g. sound guides).

Figure 10A:
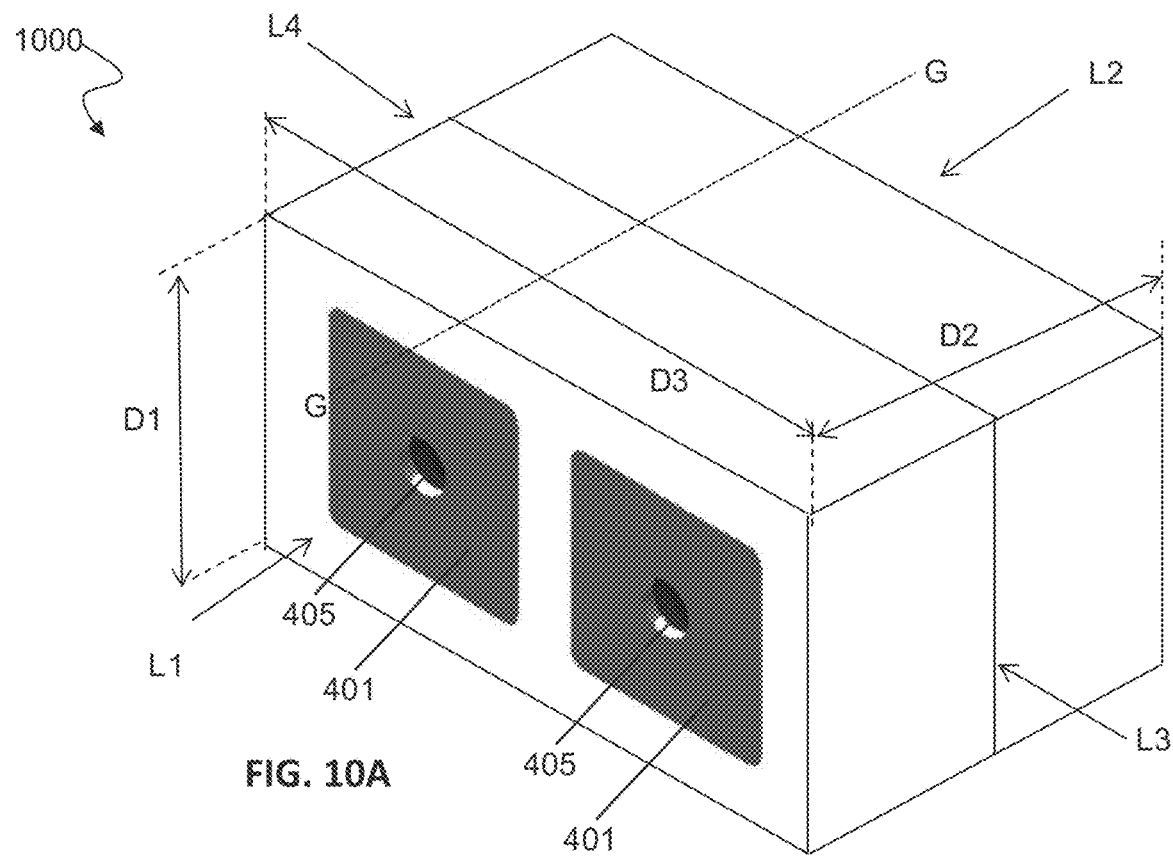
Figure 10B:
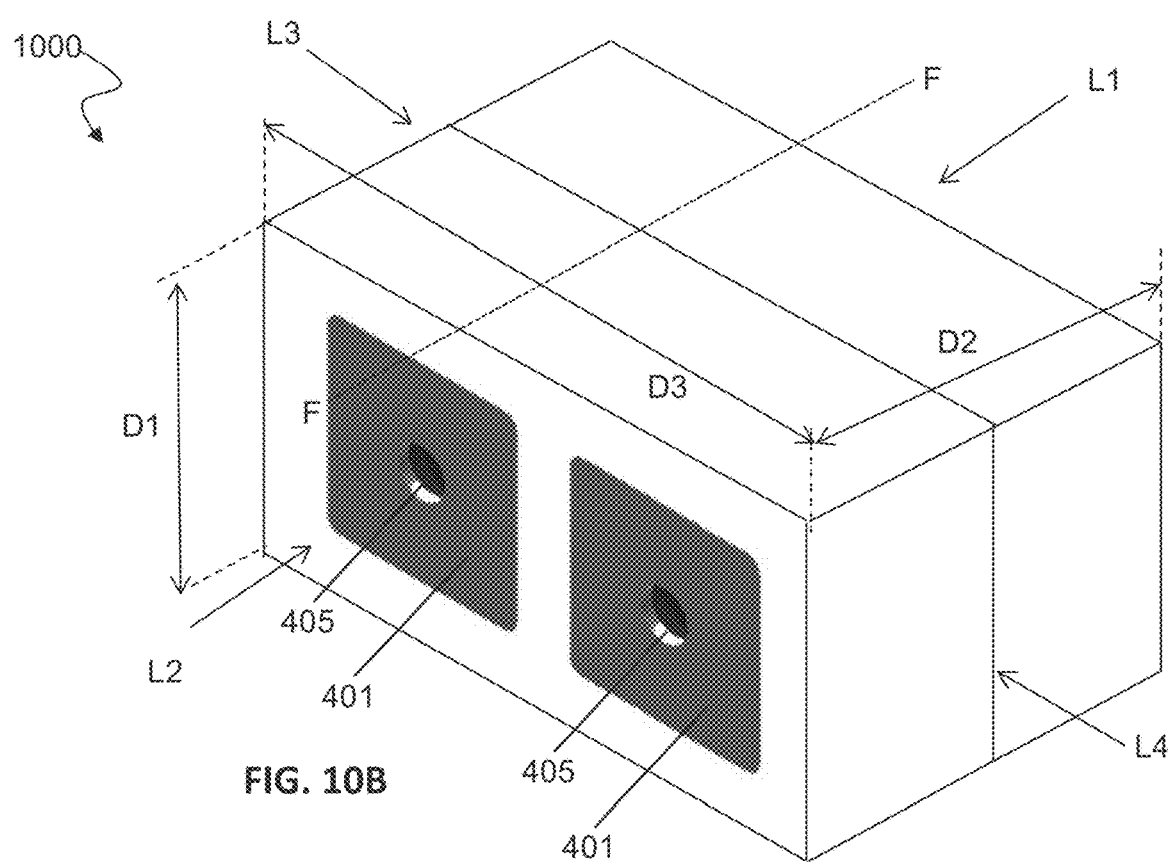
Figure 10C:
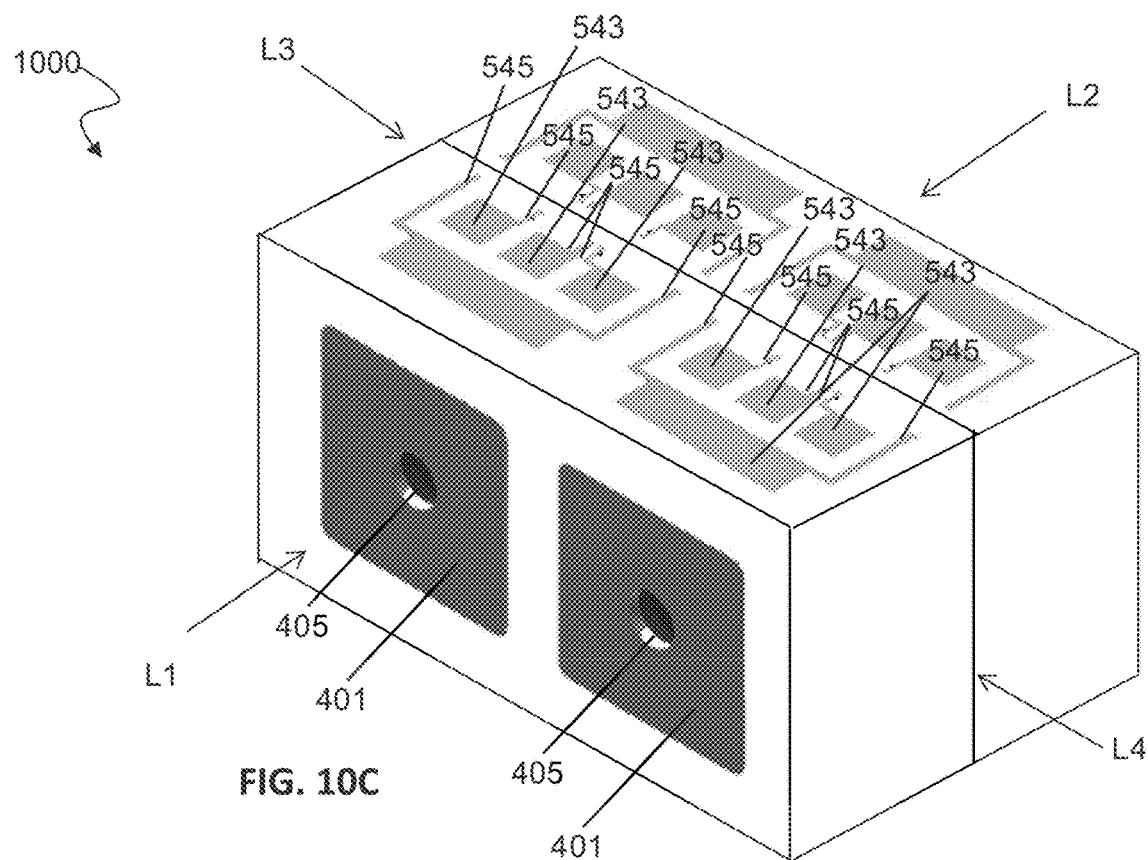
Figure 10D:
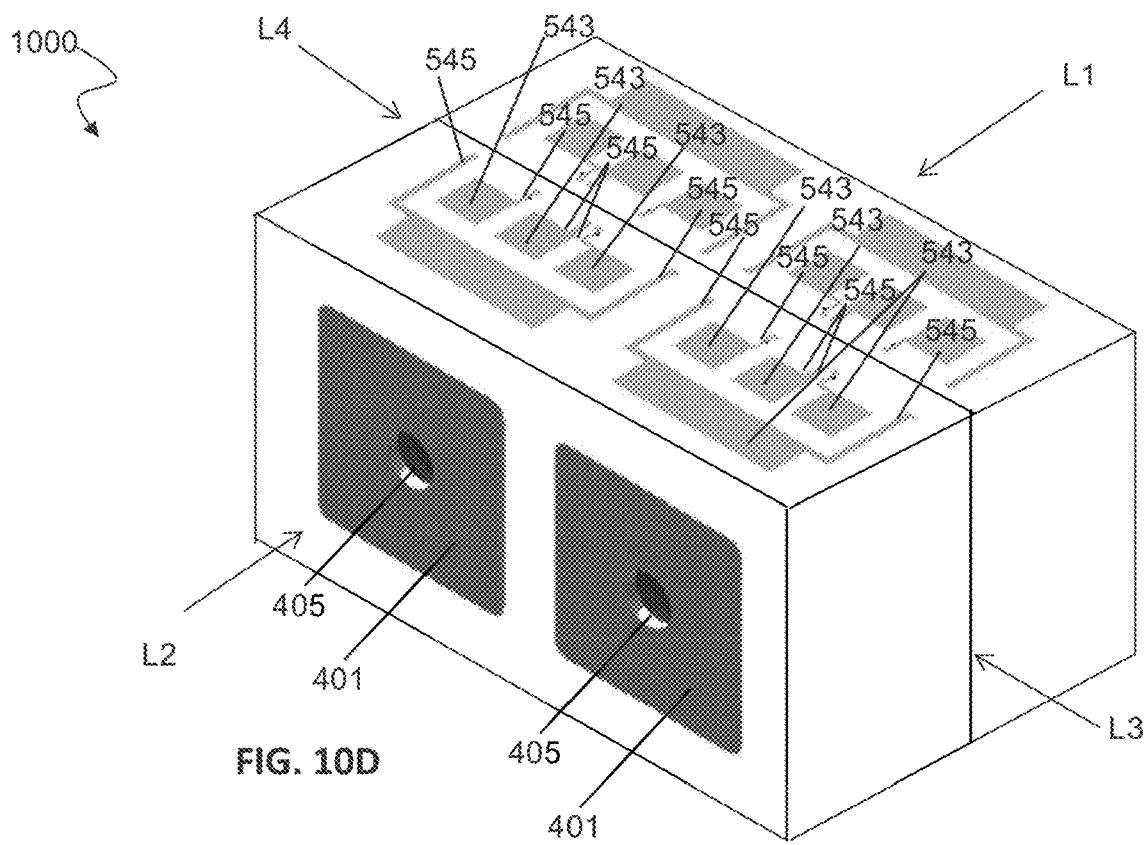
Figure 10E:
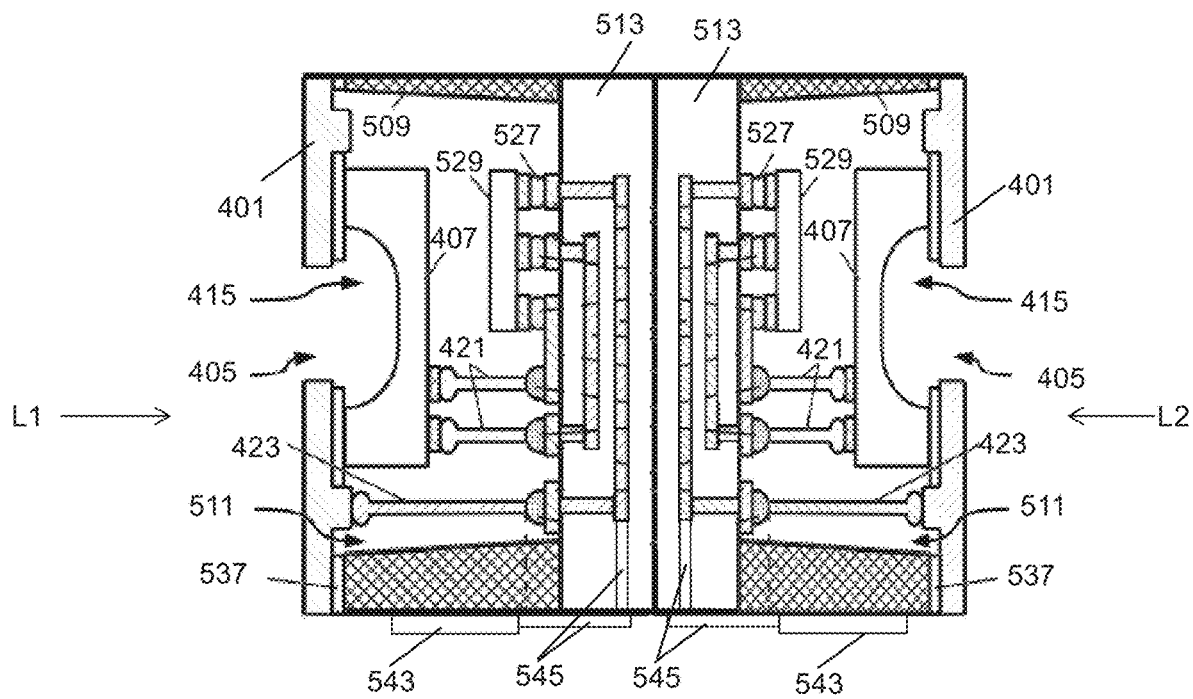

The MEMS microphone array 800 of FIGS. 8A and 8B may be combined with another MEMS microphone package 80000 to form a dual-side sound port microphone array, as shown in FIGS. 10A to 10E. FIGS. 10A and 10B schematically shows top isometric views of a MEMS microphone package 1000 having four microphones; FIGS. 10C and 10D schematically show bottom isometric views of the MEMS microphone package 1000 shown in FIGS. 10A and 10B, respectively. Additionally, FIG. 10E shows a cross-sectional view of the MEMS microphone package 1000 across line G-G of FIG. 10A. As shown in FIG. 10E, the MEMS microphone package 1000 may be formed by bonding (e.g. by an adhesive) the substrates 513 of two MEMS microphone packages 800 to each other, thereby forming a dual-side sound port microphone array. In other words, the resultant microphone array shown in FIGS. 10A to 10E has a stereo configuration.

The MEMS microphone package 1000 of FIGS. 10A to 10E includes two MEMS microphone and two acoustic input ports 405 located at each of a first lateral side L1 and a second lateral side L2 of the MEMS microphone package 1000. A third lateral side L3 and a fourth lateral side L4 of the MEMS microphone package 1000 may be formed by the molding compound of sidewalls 509. Consequently, the MEMS microphone package 1000 depicted in FIGS. 10A to 10E forms a microphone array having a first MEMS microphone array 1001 located opposite to a second MEMS microphone array 1002. Stated differently, the MEMS microphone package 1000 depicted in FIGS. 10A to 10E forms a microphone array (at the package level and not at the board level) having two sound ports 405 located at one side of the package 1000 and two other sound ports 405 located at an opposite side of the package 1000. As illustrated in FIG. 10A, the MEMS microphone package 1000 may have a first dimension D1 (e.g. a thickness) of about 2 mm, a second dimension D2 (e.g. a depth) of about 2.5 mm, and a third dimension D3 (e.g. a width) of about 4 mm, thus resulting in a compact microphone array footprint (e.g. in comparison with the example of FIG. 3). As such, the assembled MEMS microphone package 1000 (and the method of its manufacture) achieves the following advantages: (1) being compact in size (e.g. having a small package footprint); (2) having a standard BOM, while being easily configurable to be a top-ported MEMS microphone package, a bottom-ported MEMS microphone package, or a side-ported MEMS microphone package; (3) being modular in design so that it can easily be combined with other like MEMS microphone packages, at the package-level, to form a compact microphone array that may be suitable for mobile applications; and (4) being sensitive to sound waves travelling laterally (sideways) to the MEMS microphone package, without the use of additional features (e.g. sound guides).

In summary, a package and a method of manufacture thereof are provided. The proposed method results in a MEMS microphone package that is compact in size (e.g. having a small package footprint); has a standard BOM, while being easily configurable to be a top-ported MEMS microphone package, a bottom-ported MEMS microphone package, or a side-ported MEMS microphone package; is modular in design so that it can easily be combined with other like MEMS microphone packages, at the package-level, to form a compact microphone array that may be suitable for mobile applications; and is sensitive to sound waves travelling laterally (sideways) to the MEMS microphone package, without the use of additional features (e.g. sound guides).

Figure 11:
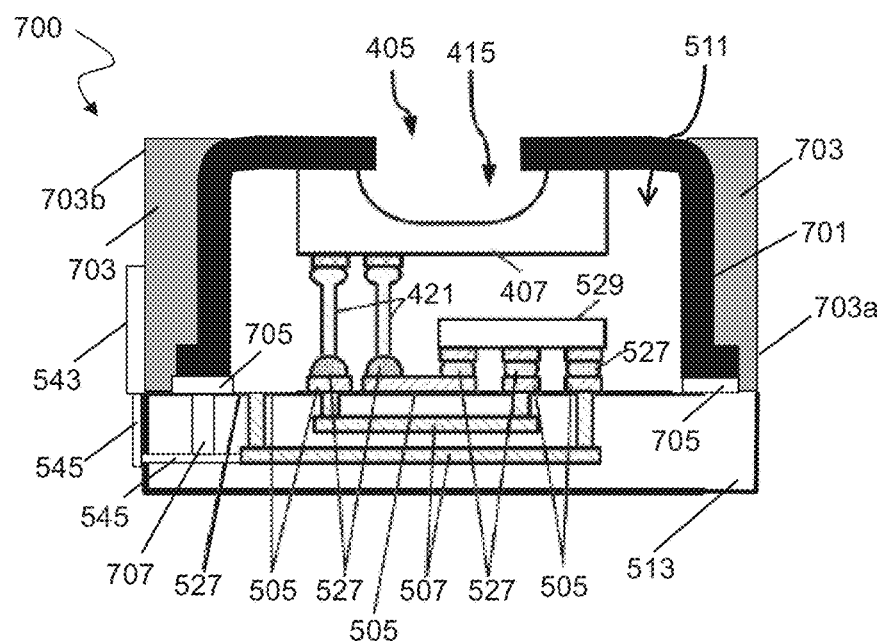
FIG. 11 shows a MEMS microphone package including a metal cap lid, according to some embodiments.

In the embodiments described above, the one or more lids of the assembled MEMS microphone package is formed by the frame 401, which can be envisioned as a flat metallic material that is attached or secured onto sidewalls 509, which include an encapsulation material such as a molding compound, a stopper pad, oxide or sealing layer. However, the proposed assembled MEMS microphone package can also be formed by a metal cap lid. FIG. 11 shows a cross-sectional view of an assembled MEMS microphone package 700 including a metal cap lid 701, in accordance with an embodiment. The example of FIG. 11 illustrates that the metal cap lid 701 is encapsulated by a molding compound 703. Surface 703*a* of the molding compound 703 forms a top surface of the MEMS microphone package 700, while an opposite surface 703*b* of the molding compound 703 forms a bottom surface of the MEMS microphone package 700. The electrical contact pads 543 and traces 545 are formed at the bottom surface 703*b* of the MEMS microphone package 700 according to methods (e.g. a plating process) described above in reference to FIG. 6E. The metal cap lid 701 may be coupled (e.g. electrically and/or physically attached to) a contact pad 705 disposed on the substrate 513. The contact pad 705 may be electrically coupled to the traces 545 and/or metal lines 507 by a via 707. As a result, a ground connection may be provided to the metal cap lid 701 through the electrical contact pads 543 and traces 545. The MEMS microphone package 700 of FIG. 11 may be used to form the MEMS microphone packages/arrays shown in FIGS. 7A, 7B, 8A, 8B, 9A to 9D, and 10A to 10D.

An embodiment device includes: a first sidewall including a first opening extending through the first sidewall; a first sensor attached to an interior surface of the first sidewall, wherein the first sensor is aligned to at least partially cover the first opening; a second sidewall opposite the first sidewall; a third sidewall attaching the first sidewall to the second sidewall; and a first contact pad disposed on an exterior surface of the third sidewall, wherein the first contact pad is configured to provide at least one of a power connection or a signal connection for the first sensor.

An embodiment MEMS microphone package includes: a first lid forming a first sidewall of the MEMS microphone package, the first lid including a first acoustic input port extending through the first lid; a first MEMS microphone die attached to an interior surface of the first lid, where the first MEMS microphone die is aligned to at least partially cover the first acoustic input port; a second sidewall opposite the first lid; a molding compound forming a third sidewall and attaching the first lid to the second sidewall; and a first input/output (I/O) pad disposed on an exterior surface of the molding compound, where the first I/O pad is configured to provide at least one of a power connection or a signal connection for the first MEMS microphone die.

An embodiment method includes: attaching a first side of a sensor to a first side of a lid, the sensor having a contact pad disposed on a second side of the sensor opposite the first side; providing an interconnect on the contact pad, where a first end of the interconnect is attached to the contact pad, and where the interconnect extends away from the contact pad; attaching a control chip to a first side of a substrate and electrically connecting the control chip to a first landing pad disposed at the first side of the substrate, the substrate further including a second landing pad disposed at the first side of the substrate and an interconnect structure disposed in a body of the substrate and electrically coupled to the second landing pad; affixing the lid over the substrate, where the affixing forms an interior cavity between the lid and the substrate that is bounded by a molding compound, and where the affixing causes a second end of the interconnect, opposite the first end of the interconnect, to be attached to the second landing pad; and forming an external contact pad and a trace on an exposed surface of the molding compound, where a first end of the trace is coupled to the external contact pad and a second end of the trace is coupled to the interconnect structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device, comprising:
    a first sidewall comprising a first opening extending through the first sidewall;
    a first sensor attached to an interior surface of the first sidewall, wherein the first sensor is aligned to at least partially cover the first opening;
    a second sidewall opposite the first sidewall;
    a third sidewall having a first thickness attaching the first sidewall to the second sidewall at a first end of the first and second sidewalls;
    a first contact pad disposed on an exterior surface of the third sidewall, wherein the first contact pad is configured to provide at least one of a power connection or a signal connection for the first sensor; and
    a fourth sidewall having a second thickness attaching the first sidewall to the second sidewall at a second end of the first and second sidewalls, wherein the first thickness is greater than the second thickness, and wherein the first and second sidewalls are substantially perpendicular to the third and fourth sidewalls.

2. The device of claim 1, wherein the first sensor comprises a first micro-electrical mechanical system (MEMS) microphone die.

3. The device of claim 1, further comprising a lid forming the first sidewall.

4. The device of claim 3, wherein the lid comprises a conductive material and provides electromagnetic interference (EMI) shielding for the first sensor.

5. The device of claim 1, further comprising a substrate, wherein the substrate comprises an interconnect structure disposed with a body of the substrate.

6. The device of claim 5, further comprising a trace disposed on the exterior surface of the third sidewall and electrically coupling the interconnect structure and the first contact pad to each other, wherein a first end of the trace is coupled to the first contact pad and a second end of the trace is coupled to the interconnect structure.

7. The device of claim 6, wherein a first portion of the trace is disposed on the exterior surface of the third sidewall, wherein a second portion of the trace extends through the substrate, and wherein the first portion of the trace is perpendicular to the second portion of the trace.

8. The device of claim 5, wherein the substrate forms the second sidewall.

9. The device of claim 1, further comprising a second opening and a second sensor aligned to at least partially cover the second opening.

10. The device of claim 9, wherein the second opening extends through the first sidewall and is adjacent to the first opening, and wherein the second sensor is attached to the interior surface of the first sidewall.

11. The device of claim 10, further comprising:
a third opening and a fourth opening extending through the second sidewall, wherein the third opening is adjacent to the fourth opening; and
a third sensor and a fourth sensor aligned to at least partially cover the third opening and the fourth opening, respectively.

12. The device of claim 9, wherein the second opening extends through the second sidewall and is directed away from the first opening, and wherein the second sensor is attached to an interior surface of the second sidewall.

13. The device of claim 9, further comprising a second contact pad disposed on the exterior surface of the third sidewall, wherein the second contact pad is configured to provide at least one of a power connection or a signal connection for the second sensor.

14. The device of claim 9, further comprising an interior cavity and a control chip disposed within the interior cavity, the control chip being configured to be in electrical communication with the first sensor.

15. A MEMS microphone package, comprising:
a first lid forming a first sidewall of the MEMS microphone package, the first lid comprising a first acoustic input port extending through the first lid;
a first MEMS microphone die attached to an interior surface of the first lid, wherein the first MEMS microphone die is aligned to at least partially cover the first acoustic input port;
a second sidewall opposite the first lid;
a molding compound forming a third sidewall and attaching the first lid to a first end of the second sidewall; and
a first input/output (I/O) pad disposed on an exterior surface of the molding compound, wherein the first I/O pad is configured to provide at least one of a power connection or a signal connection for the first MEMS microphone die; and
a molding compound forming a fourth sidewall separate from the third sidewall and attaching the first lid to a second of the second sidewall, wherein a thickness of the third sidewall is greater than a thickness of the fourth sidewall, and wherein the first and second sidewalls are substantially perpendicular to the third and fourth sidewalls.

16. The MEMS microphone package of claim 15, further comprising an interior cavity and an application specific integrated circuit (ASIC) die disposed within the interior cavity and electrically coupled to the first MEMS microphone die.

17. The MEMS microphone package of claim 16, wherein the first MEMS microphone die and the ASIC die spatially overlap at least partially.

18. The MEMS microphone package of claim 15, further comprising a printed circuit board, wherein the printed circuit board comprises an interconnect structure disposed with a body of the printed circuit board.

19. The MEMS microphone package of claim 18, further comprising a trace disposed on the exterior surface of the third sidewall and electrically coupling the interconnect structure and the first I/O pad to each other, wherein a first end of the trace is coupled to the first I/O pad and a second end of the trace is coupled to the interconnect structure, and wherein an angle subtended between the first end of the trace and the second end of the trace is substantially 90 degrees.

20. The MEMS microphone package of claim 18, wherein an exterior surface of the printed circuit board forms an exterior surface of the second sidewall.

21. The MEMS microphone package of claim 15, further comprising a second acoustic input port and a second MEMS microphone die aligned to at least partially cover the second acoustic input port.

22. The MEMS microphone package of claim 21, wherein the second acoustic input port extends through the first lid and is adjacent to the first acoustic input port, and wherein the second MEMS microphone die is attached to the interior surface of the first lid.

23. The MEMS microphone package of claim 21, further comprising a second lid forming the second sidewall, wherein the second acoustic input port extends through the second lid and is directed away from the first acoustic input port, and wherein the second MEMS microphone die is attached to an interior surface of the second lid.

24. The MEMS microphone package of claim 23, wherein the first lid and the second lid comprise a conductive material and provide electromagnetic interference (EMI) shielding for the first MEMS microphone die and the second MEMS microphone die, respectively.

25. A method, comprising:
attaching a first side of a sensor to a first side of a lid, the sensor having a contact pad disposed on a second side of the sensor opposite the first side;
providing an interconnect on the contact pad, wherein a first end of the interconnect is attached to the contact pad, and wherein the interconnect extends away from the contact pad;
attaching a control chip to a first side of a substrate and electrically connecting the control chip to a first landing pad disposed at the first side of the substrate, the substrate further comprising a second landing pad disposed at the first side of the substrate and an interconnect structure disposed in a body of the substrate and electrically coupled to the second landing pad;
affixing the lid over the substrate, wherein the affixing forms an interior cavity between the lid and the substrate that is bounded by a molding compound, and wherein the affixing causes a second end of the interconnect, opposite the first end of the interconnect, to be attached to the second landing pad; and
forming an external contact pad and a trace on an exposed surface of the molding compound, wherein a first end of the trace is coupled to the external contact pad and a second end of the trace is coupled to the interconnect structure, wherein the molding compound comprises a first sidewall having a first thickness, and a second sidewall having a second thickness less than the first thickness.

26. The method of claim 25, wherein the first end of the trace is perpendicular to the second end of the trace.

27. The method of claim 25, wherein forming the external contact pad and the trace on the exposed surface of the molding compound comprises a plating process.

28. The method of claim 25, wherein providing the interconnect comprises forming a wirebond interconnect with the first end of the interconnect as a ball end.

* * * * *